United States Patent
Nishigori et al.

(10) Patent No.: US 11,594,113 B2
(45) Date of Patent: Feb. 28, 2023

(54) DECODING DEVICE, DECODING METHOD, AND PROGRAM

(71) Applicant: Sony Group Corporation, Tokyo (JP)

(72) Inventors: Shuichiro Nishigori, Tokyo (JP); Ikuo Yamano, Tokyo (JP); Shiro Suzuki, Kanagawa (JP); Hirofumi Takeda, Kanagawa (JP); Takahiro Watanabe, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/422,155

(22) PCT Filed: Jan. 10, 2020

(86) PCT No.: PCT/JP2020/000634
§ 371 (c)(1),
(2) Date: Jul. 9, 2021

(87) PCT Pub. No.: WO2020/149227
PCT Pub. Date: Jul. 23, 2020

(65) Prior Publication Data
US 2022/0092952 A1 Mar. 24, 2022

(30) Foreign Application Priority Data
Jan. 17, 2019 (JP) .............................. JP2019-006223

(51) Int. Cl.
*G08B 6/00* (2006.01)

(52) U.S. Cl.
CPC ...................................... *G08B 6/00* (2013.01)

(58) Field of Classification Search
CPC .......... A63F 13/285; G08B 6/00; H03M 7/30; H03M 7/40; G06F 3/016
See application file for complete search history.

(56) References Cited

U.S. PATENT DOCUMENTS

2003/0142098 A1* 7/2003 Kim ....................... H04N 19/20
345/646

FOREIGN PATENT DOCUMENTS

| JP | H09-130263 A | 5/1997 |
| JP | 2000-228633 A | 8/2000 |

(Continued)

OTHER PUBLICATIONS

International Search Report and English translation thereof dated Mar. 17, 2020 in connection with International Application No. PCT/JP2020/000634.

(Continued)

*Primary Examiner* — Quan Zhen Wang
*Assistant Examiner* — Rajsheed O Black-Childress
(74) *Attorney, Agent, or Firm* — Wolf, Greenfield & Sacks, P.C.

(57) ABSTRACT

Provided is a decoding device including a decoding unit configured to decode encoded data in which a differential signal that includes a differential between a tactile signal and a reference signal has been encoded, and a signal addition unit configured to add the reference signal and the differential signal. In addition, provided is a decoding method by a processor, the decoding method including decoding encoded data in which a differential signal that includes a differential between a tactile signal and a reference signal has been encoded, and adding the reference signal and the differential signal that has been decoded.

17 Claims, 21 Drawing Sheets

(56) References Cited

FOREIGN PATENT DOCUMENTS

| | | |
|---|---|---|
| JP | 2002-329217 A | 11/2002 |
| JP | 2012-113657 A | 6/2012 |
| JP | 2016-202486 A | 12/2016 |

OTHER PUBLICATIONS

Sakr et al., Prediction-based haptic data reduction and compression in tele-mentoring systems. IEEE Instrumentation and Measurement Technology Conference. May 2008. 5 pages.

Shahabi et al., A comparison of different haptic compression techniques. IEEE International Conference on Multimedia and Expo. Aug. 2002. pp. 657-660.

* cited by examiner

FIG. 5
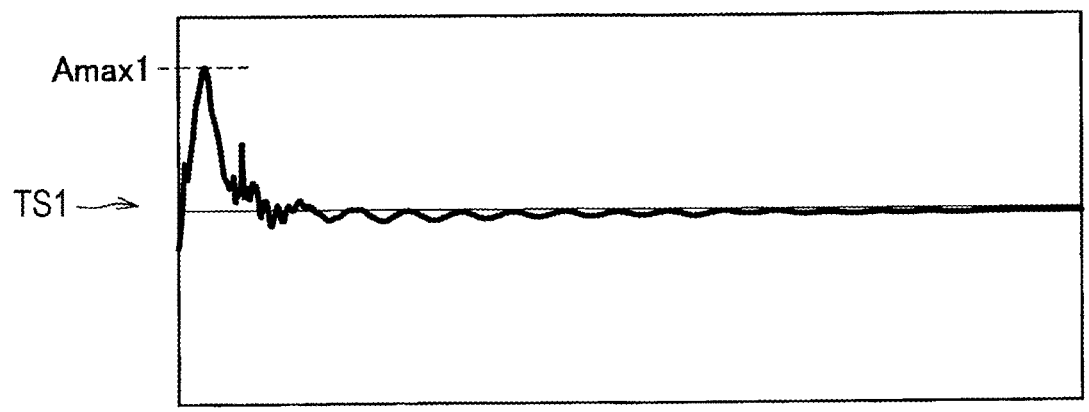
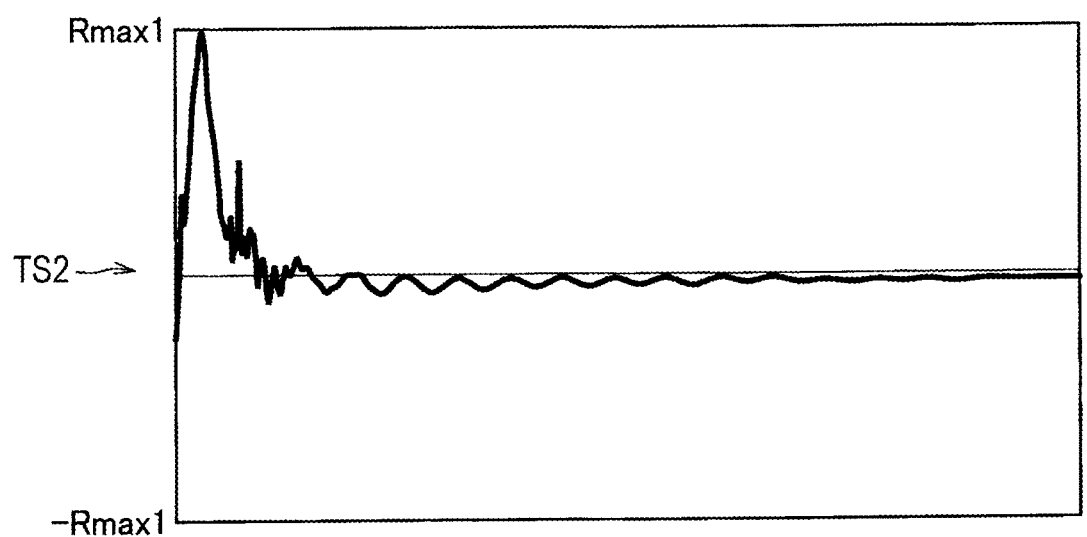

FIG. 8

| SCENE ID | SCENE | TACTILE EXPERIENCE ID | TACTILE EXPERIENCE |
|---|---|---|---|
| 0 | BASEBALL | 0 | FEELING OF FINGERS AT TIME OF HITTING BALL WITH BAT |
| | | 1 | FEELING OF FINGERS AT TIME OF CATCHING BALL WITH GLOVE |
| | | 2 | FEELING OF FEET AT TIME OF SLIDING |
| 1 | SOCCER | 0 | FEELING OF FOOT AT TIME OF KICKING BALL |
| | | 1 | FEELING OF BODY AT TIME OF TRAPPING BALL |
| 2 | HISTORICAL DRAMA | 0 | FEELING OF BODY AT TIME OF BEING CUT BY SWORD |
| | | 1 | FEELING OF FINGERS AT TIME OF STRIKING SWORD AND WHEN SWORDS CLASH |
| 3 | BATTLE | 0 | FEELING OF FINGERS, BODY, AND FEET AT TIME OF BEING INVOLVED IN EXPLOSION |
| | | 1 | FEELING OF BODY AT TIME OF BEING SHOT BY GUN |
| | | 2 | FEELING OF FINGERS AT TIME OF SHOOTING WITH GUN |
| | | 3 | FEELING OF FINGERS, BODY, AND FEET AT TIME OF PERCEIVING GROUND VIBRATION |
| 4 | MUSIC | 0 | FEELING OF FINGERS AT TIME OF BEATING SNARE DRUM |
| | | 1 | FEELING OF FINGERS AT TIME OF CLASHING CYMBALS |

TA

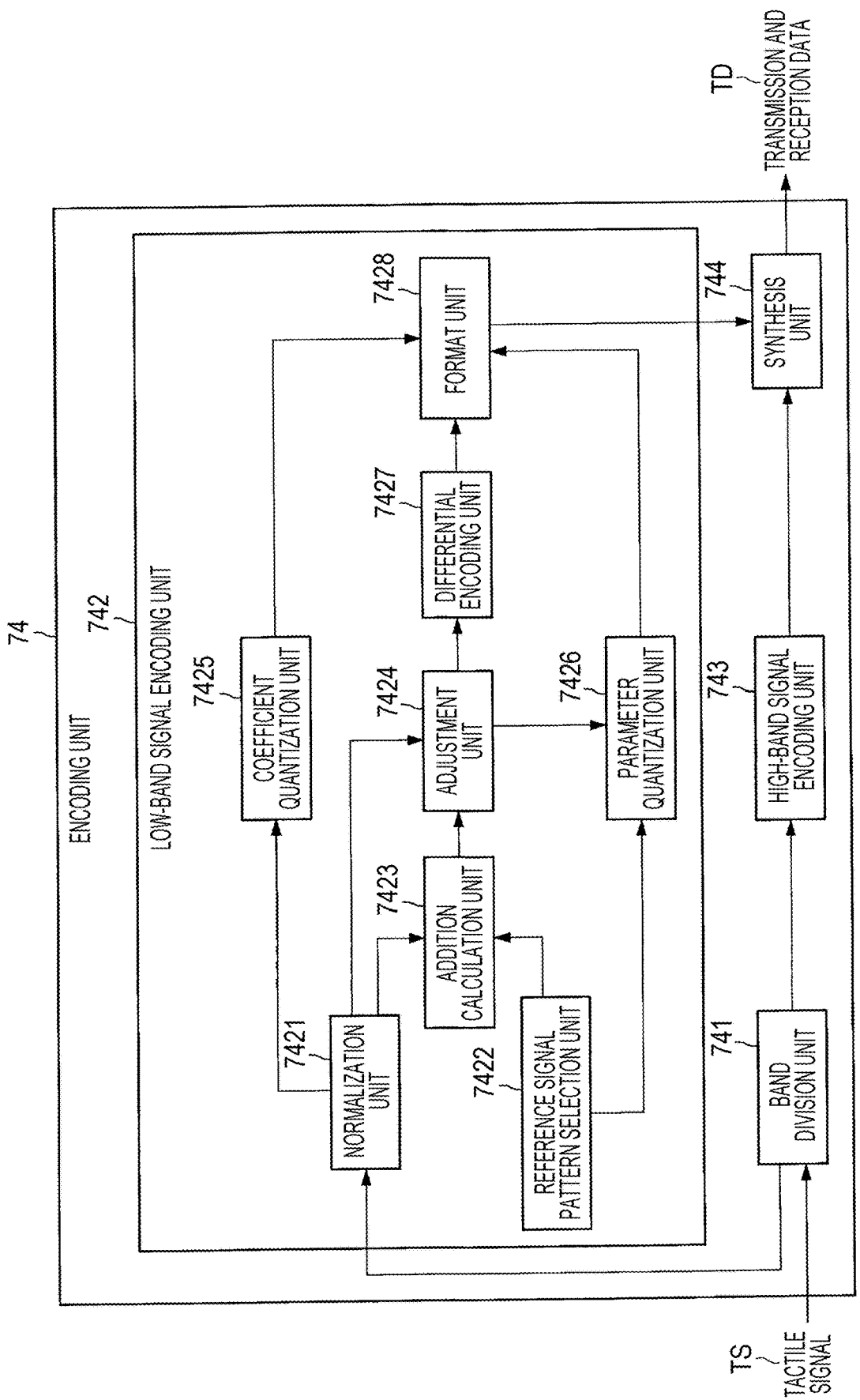

DECODING DEVICE, DECODING METHOD, AND PROGRAM

CROSS-REFERENCE TO RELATED APPLICATIONS

This is a U.S. National Stage Application under 35 U.S.C. § 371, based on International Application No. PCT/JP2020/000634, filed in the Japanese Patent Office as a Receiving Office on Jan. 10, 2020, which claims priority under 35 U.S.C. § 119(a)-(d) or 35 U.S.C. § 365(b) to Japanese Patent Application Number JP2019-006223, filed in the Japanese Patent Office on Jan. 17, 2019, each of which is hereby incorporated by reference in its entirety.

TECHNICAL FIELD

The present disclosure relates to a decoding device, a decoding method, and a program.

BACKGROUND ART

In these years, a technique is developed for giving a tactile stimulus to a user on the basis of a tactile signal that has been received from an external device. For example, Patent Document 1 discloses a technique for giving a tactile stimulus to a user while changing the frequency and amplitude of vibrations on the basis of a received signal.

CITATION LIST

Patent Document

Patent Document 1: Japanese Patent Application Laid-Open No. 2016-202486

SUMMARY OF THE INVENTION

Problems to be Solved by the Invention

In a case where a transmission delay of a tactile signal occurs, by the way, such a delay may lead to a situation in which it is difficult to synchronize a tactile sensation with another sensation related to an image, a sound, or the like. In the technique described in Patent Document 1, however, no consideration is given to the signal transmission delay resulting from an increase in data amount of tactile signals according to improvements in quality of the tactile sensation or signal retransmission according to a data loss at the time of signal transmission or reception.

Solutions to Problems

According to the present disclosure, provided is a decoding device including: a decoding unit configured to decode encoded data in which a differential signal that includes a differential between a tactile signal and a reference signal has been encoded; and a signal addition unit configured to add the reference signal and the differential signal.

Further, according to the present disclosure, provided is a decoding method by a processor, the decoding method including decoding encoded data in which a differential signal that includes a differential between a tactile signal and a reference signal has been encoded; and adding the reference signal and the differential signal that has been decoded.

Further, according to the present disclosure, provided is a program causing a computer to function as a decoding device including: a decoding unit configured to decode encoded data in which a differential signal that includes a differential between a tactile signal and a reference signal has been encoded; and a signal addition unit configured to add the reference signal and the differential signal that has been decoded.

BRIEF DESCRIPTION OF DRAWINGS

FIG. 5 is a diagram for describing an example of a normalization process by a normalization unit 341 according to the embodiment.

FIG. 8 is a diagram for describing an example in a case where the reference signal pattern according to the embodiment is a sampling signal.

FIG. 17A is a diagram for describing a functional configuration example of an encoding unit 74 in a modification example according to the embodiment.

MODE FOR CARRYING OUT THE INVENTION

Figure 1A:
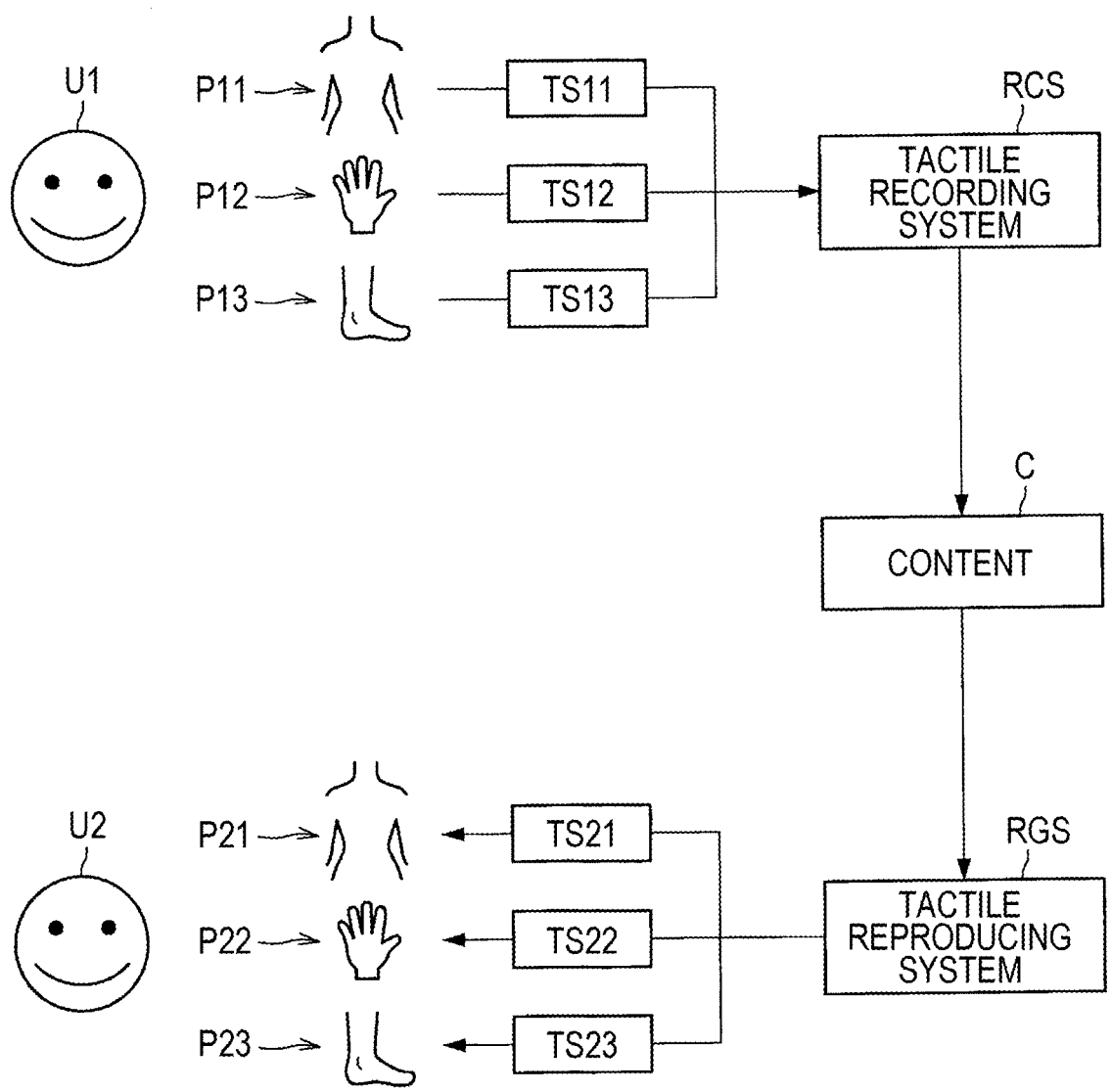
FIG. 1A is a diagram for describing an example of transmission of a tactile signal TS according to the present disclosure.

Hereinafter, preferred embodiments of the present disclosure will be described in detail with reference to the accompanying drawings. It is to be noted that in the present specification and the drawings, components having substantially the same functional configuration are designated by the same reference numerals to omit duplicate description.

It is to be noted that the description will be given in the following order.

1. Background
2. Embodiment
   2.1. Overview
      2.1.1. Overview of tactile presentation
      2.1.2. Overview of tactile presentation system 1
   2.2. Functional configuration example
      2.2.1. Functional configuration example of encoding device 3
      2.2.2. Functional configuration example of encoding unit 34
      2.2.3. Functional configuration example of reproducing device 4
      2.2.4. Functional configuration example of decoding device 5
      2.2.5. Functional configuration example of decoding unit 54
   2.3. Operation example
      2.3.1. Operation example of tactile recording system RCS
      2.3.2. Operation example of tactile reproducing system RGS
   2.4. Modification example
3. Hardware configuration example
4. Conclusion

1. BACKGROUND

First, the background of the present disclosure will be described. In these years, a technique, in which a device worn by a user vibrates to give a tactile stimulus to the user, is developed. Here, the tactile stimulus refers to a physical phenomenon that makes the user feel a tactile sensation using a vibration phenomenon or the like. In addition, generating a tactile stimulus is referred to as a tactile presentation.

Techniques dealing with the tactile presentations are utilized in devices in various fields. For example, on a terminal device equipped with a touch panel, such as a smartphone or the like, the touch panel vibrates in response to a touch operation of a user, and gives a tactile stimulus to a user's finger, so as to enable representation of a touch feeling onto a button or the like displayed on the touch panel. Further, for example, on a music listening device such as a headphone or the like, a tactile stimulus is given in accordance with playing of music, so as to enable emphasis on the deep bass in the music being played. Further, for example, on a device for providing a computer game or virtual reality (VR), the controller or the like is made to vibrate in accordance with an operation using the controller or a content scene to give a tactile stimulus, so as to enable an improvement in the user's immersion feeling on a content.

By the way, in a case where the tactile presentation is given on a plurality of parts of the user's body using the devices as described above, a signal representing a tactile vibration pattern, that is, a signal including a vibration that makes feel a predetermined tactile sensation (hereinafter, referred to as a tactile signal TS) has to be prepared as a channel for every part of the user.

Here, in a case where a device for performing the tactile presentation receives the tactile signal TS from an external device, for example, it is supposed that the following situation occurs.

First, for the purpose of increasing the influence of the tactile stimulus on the user, it is predicted that as the number of the parts to which the tactile stimulus is given increases, the total data amount of necessary tactile signals TS increases. Further, also in a case where the width of the vibration frequency included in the tactile signal TS becomes larger, the total data amount of the necessary tactile signals TS increases. Therefore, a congestion state on a network used for transmission and reception of the tactile signal TS may cause a delay in the transmission and reception of the tactile signal TS.

Here, a specific factor that causes the delay in the transmission and reception of the tactile signal TS will be described while giving an example of human tactile characteristics and the data amount of the tactile signal TS.

First, the human tactile characteristics will be described. In a case where humans perceive vibrations as the tactile sensations, the sensitivity as the tactile sensation differs depending on the vibration frequency. Hereinafter, a degree of the sensitivity as the tactile sensation will be referred to as "a tactile sensitivity". Regarding the tactile sensitivity, for example, experimental results have been reported in "Four channels mediate the mechanical aspects of touch S. J., Bolanowski 1988". As exhibited in the experimental results, in general, the frequency of approximately 200 Hz suggests the highest tactile sensitivity of humans. For such a reason, from the above-described viewpoint, devices and applications that generate vibrations are designed to generate the vibrations up to approximately 200 Hz, in many cases.

On the other hand, although not exhibited in the above experimental results, it is commonly known that humans can perceive vibrations of frequencies up to approximately 1 kHz as the tactile sensations. Humans can perceive vibrations with frequency components of approximately 1 kHz and vibrations without the frequency components to be different tactile sensations from each other.

For example, vibrations generated in a case where a cork stopper of a bottle is pulled out include vibrations with frequencies up to several kHz. In a case where such vibrations are transmitted as vibrations up to approximately several hundred Hz from a device for presenting the tactile sensation, a user cannot satisfactorily perceive the vibrations with a realistic feeling as the tactile sensation occurring when pulling out the cork stopper.

Therefore, in order to give the user a more realistic tactile sensation, it is necessary to give the tactile presentation using vibrations including frequencies up to approximately 1 kHz. However, as the width of the frequency included in the signal becomes larger, the data amount of the signal increases.

This may lead to a high possibility that a delay in the transmission and reception of the signal occurs. That is, improvements in quality of the tactile sensation may cause a situation in which the tactile sensation cannot be presented at an appropriate timing. Hereinafter, the delay in the signal transmission and reception and the tactile presentation will be described with reference to specific examples.

First, the data amount of the tactile signal TS will be described. In a case where the tactile signal TS is transmitted between devices, first, the tactile signal TS is converted into digital data. The capacity of the digital data is represented by a bit depth needed per unit time, that is, a bit rate B. Incidentally, the tactile sensitivity depends on not only the vibration frequency but also the amplitude. For example, in the above-described experimental results, it is exhibited that the amplitude of vibrations that can be perceived by humans is approximately 50 dB (−20 dB to 30 dB) or more, and the frequency is approximately 1000 Hz. It is to be noted that in the following description, in consideration of the distribution of tactile information that can be actually perceived by humans, it is conceivable that the amplitude of the vibration is approximately 70 dB.

In a case where the tactile signal TS is converted into digital data using linear pulse code modulation (LPCM), the amplitude of the vibration that can be expressed by one bit is 6 dB. In other words, 70 dB of the amplitude of the vibration needs 12 bits. On the other hand, in a case where the frequency of the vibration is 1000 Hz, the sampling frequency needs 2000 Hz, which is a double, and a bit rate $B_0$ is calculated by Expression (1).

[Expression 1]

$$B_0=12\ [\text{bit/sample}]\times 2000\ [\text{sample/sec}]=24\ [\text{kbit/sec}] \qquad (1)$$

The bit rate $B_0$ obtained by Expression (1) is, for example, smaller than a bit rate of 700 [kbps/ch] of a compact disk (CD), which is a representative format for audio signals. Therefore, it is supposed that there is a high possibility that no problem occurs in transmission of a single tactile signal TS.

However, in a case of preparing a tactile signal TS, by which a user perceives a tactile sensation with higher reality, the necessary data amount increases remarkably.

Hereinafter, a description will be given specifically. For example, the bit rate B is 48 [kbit/sec] in a case where the frequency range of the tactile signal TS is up to 2000 kHz. In addition, in a case where devices for giving tactile stimuli to a human body are respectively installed at fingertips of both hands of a user, the bit rate B becomes 480 [kbit/sec], which is 10 times that of a single tactile signal TS. In a case where installation parts are further increased, for example, on finger joints, palms, and the like, the bit rate B is further increased.

In addition, the tactile signal TS in the above description is basically a one-dimensional vibration signal, but may be a three-dimensional vibration signal. In the tactile signal TS of a three-dimensional vibration, the bit rate B becomes 1440 [kbit/sec], as compared with a case where the bit rate B needed for respectively giving the tactile stimuli to ten parts as described above is 480 [kbit/sec]. Incidentally, the value of the calculated bit rate B is a value exceeding 1411 [kbit/sec], which is the bit rate of an audio CD.

In this manner, the total data amount of the tactile signal TS to be needed increases, as the reality of the tactile stimulus improves or the number of user's parts onto which the tactile stimulus is given increases. As a result, such an increase in the total data amount becomes a large load on a network system for transmitting the tactile signals TS.

In addition to the situation resulting from the data amount as described above, in a case where the tactile signal TS is transmitted by wireless communication, it is supposed that a loss of data in which the tactile signal TS has been encoded may occur due to interference on a transmission path or the like. In a case where the data loss occurs, the data loss may cause a delay of a period while the data is retransmitted from a device on a transmitting side and the data is received on a receiving side. That is, as the capacity of the data to be retransmitted increases, the time needed for retransmitting the data in accordance with the data loss increases. Consequently, a period for normally completing transmission and reception of the tactile signal TS may be further delayed.

As described above, the period for completing the transmission of the data in which the tactile signal TS has been encoded may be delayed, and the reproducibility of the tactile sensation may be degraded. Specifically, the tactile stimulus cannot be given to the user at an appropriate timing. Therefore, a situation in which the tactile stimulus cannot be synchronized with a content related to other sensations such as video, sound, and the like may occur.

Next, a description will be given with regard to an application of a specific wireless communication method in consideration of the above-described situation. First, the device for performing the tactile presentation is installed in contact with a user. Therefore, wireless communication with other devices is generally desirable from the viewpoint of a device weight. However, for example, in a case where a broadband wireless system such as Wi-Fi (registered trademark) or the like is used, the battery of the device becomes larger in size from the viewpoint of power consumption. Hence, it is supposed that the convenience for users is degraded. In addition, in a case of using Wi-Fi (registered trademark), it generally takes a process time for a procedure from a signal transmission request from a device on the transmitting side to a reception process of a device on a receiving side. Accordingly, a larger delay than other wireless systems may occur.

On the other hand, in a case of a short-range wireless system such as Bluetooth (registered trademark) or the like, communication can be carried out with smaller power consumption and a smaller delay than those of other wireless systems. Therefore, it is considered to be suited for the transmission of the tactile signal TS. However, in the short-range wireless system, limitation on the data amount that can be transmitted at one time is smaller than those of other wireless systems. For example, in the transmission of a content that gives a tactile stimulus to a user in synchronization with video, sound, and the like, it is supposed that the communication capacity to be allocated to the transmission of the tactile signal TS is insufficient.

In addition, in a service for streaming video and audio via the Internet, in a case where the tactile sensation is additionally conveyed to the user, a situation is supposed that the communication capacity allocated to the transmission of the tactile signal TS is insufficient due to, for example, a quality of service (QoS) function according to the situation on a network line.

Besides, even in a case where a known encoding process is applied to the tactile signal TS as a countermeasure against the above situation, an appropriate encoding process may not be necessarily performed. For example, in a case where an encoding system for audio signals that are one-dimensional signals, for example, MPEG audio layer 3 (MP3), advanced audio coding (AAC), or the like is applied to the tactile signal TS, there is a possibility that information important for tactile reproduction is abandoned. This is because the encoding system for audio signals is a system in which human auditory characteristics are considered, but is not a system in which human tactile characteristics are considered.

The present disclosure has been made in view of the above circumstances, and an object of the present disclosure is to reduce a data amount of signals, so as to transmit a signal presenting a tactile sensation with a higher quality at a lower delay.

2. EMBODIMENT

Hereinafter, an example of an embodiment of the present disclosure will be described.

2.1. Overview

[2.1.1. Overview of Tactile Presentation]

First, an overview of the tactile presentation and the tactile signal TS will be described with reference to FIGS. 1A and 1B.

First, a description will be given with reference to FIG. 1A. FIG. 1A is a diagram for describing an overview of the tactile presentation according to the present disclosure. As shown in FIG. 1A, vibrations are sensed as tactile signals TS11, TS12, and TS13 by tactile sensors respectively attached onto a body P11, a hand P12, and a foot P13 of a user U1.

A tactile recording system RCS encodes the tactile signals TS11 to TS13 that have been recorded, and generates encoded data. The tactile recording system RCS transmits the encoded data that has been generated, as a content C including additional information, to a tactile reproducing system RGS.

The tactile reproducing system RGS decodes the encoded data on the basis of the received content C, and generates tactile signals TS21 to TS23. Devices attached onto a body P21, a hand P22, and a foot P23 of a user U2 respectively give tactile stimuli on the basis of the tactile signals TS21 to TS23 that have been decoded. It is to be noted that in general, the tactile signals TS21 to TS23 are similar to the tactile signals TS11 to TS13.

In this manner, the tactile sensation can be conveyed to the user by transmitting and receiving the tactile signal TS as encoded data.

Next, an example of the tactile signal TS will be described with reference to FIG. 1B. FIG. 1B is a diagram for describing an example of the tactile signal TS according to the present embodiment. FIG. 1B shows tactile signals TS31, TS32, and TS33 respectively corresponding to a body P31, a hand P32, and a foot P33 of a user. As shown in FIG. 1B, for example, vibrations of the tactile signal TS are recorded in a time-series order.

Figure 1B:
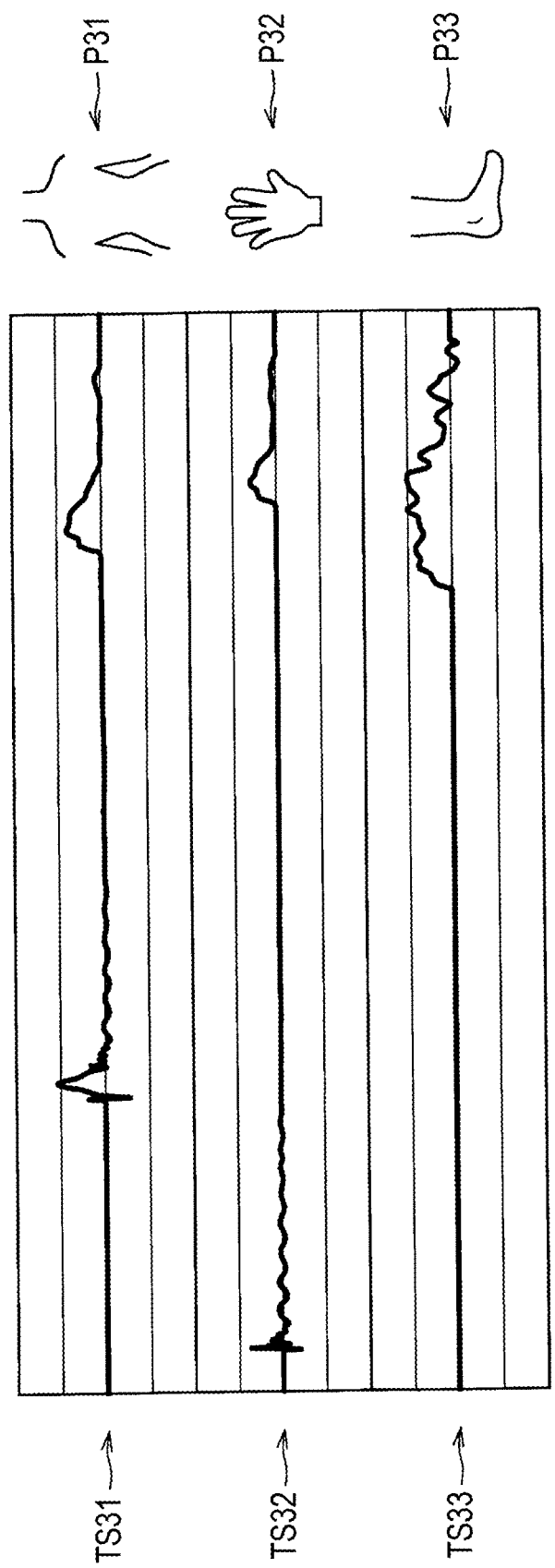
FIG. 1B is a diagram for describing an example of the tactile signal TS according to the present embodiment.

In the example of FIG. 1B, the vibrations indicated by the tactile signals TS31 to TS33 are vibrations respectively corresponding to predetermined scenes. A description will be given in a time-series order. First, the tactile signal TS32 includes a vibration of the hand P32 in reaction to shooting a gun, and next the tactile signal TS31 includes a vibration of the body P31 due to an impact of being shot by a gun. In addition, a latter half (a right side) of the tactile signals TS31 to TS33 includes the body P31, the hand P32, and the foot P33 respectively vibrating due to an occurrence of an earthquake. Here, what is indicated is that the foot P33 vibrates first, the body P31 vibrates after a predetermined time lapses, and the hand P32 vibrates after a further predetermined time lapses.

As described above, the vibrations of the tactile stimuli corresponding to respective scenes have characteristics. In particular, the vibrations of the tactile stimuli respectively have unique waveforms, in many cases. Further, as indicated by the tactile signals TS31 to TS33, a tactile stimulus often occurs for a short period of time with respect to a predetermined scene. In the tactile presentation system 1 according to the present embodiment, the tactile signal TS is transmitted using the above characteristics. Therefore, regarding the vibrations of the tactile signals TS to be transmitted and received, the waveforms can be supposed to some extent, in many cases.

The tactile presentation system 1 according to the present embodiment compresses the data amount of the signal to be transmitted and received, on the basis of a prediction of the waveform of the tactile signal TS. Specifically, the tactile presentation system 1 according to the present embodiment encodes a signal of a differential between the tactile signal TS and a signal similar to the tactile signal TS, that is, for example, a signal, the data amount of which is reduced after variable length encoding, and compresses the data amount, so as to enable both the reproducibility of the tactile sensation and a reduction in the data amount for transmission and reception. Hereinafter, functions of the respective configurations of the tactile presentation system 1 will be described in detail.

[2.1.2. Overview of Tactile Presentation System 1]

Figure 2:
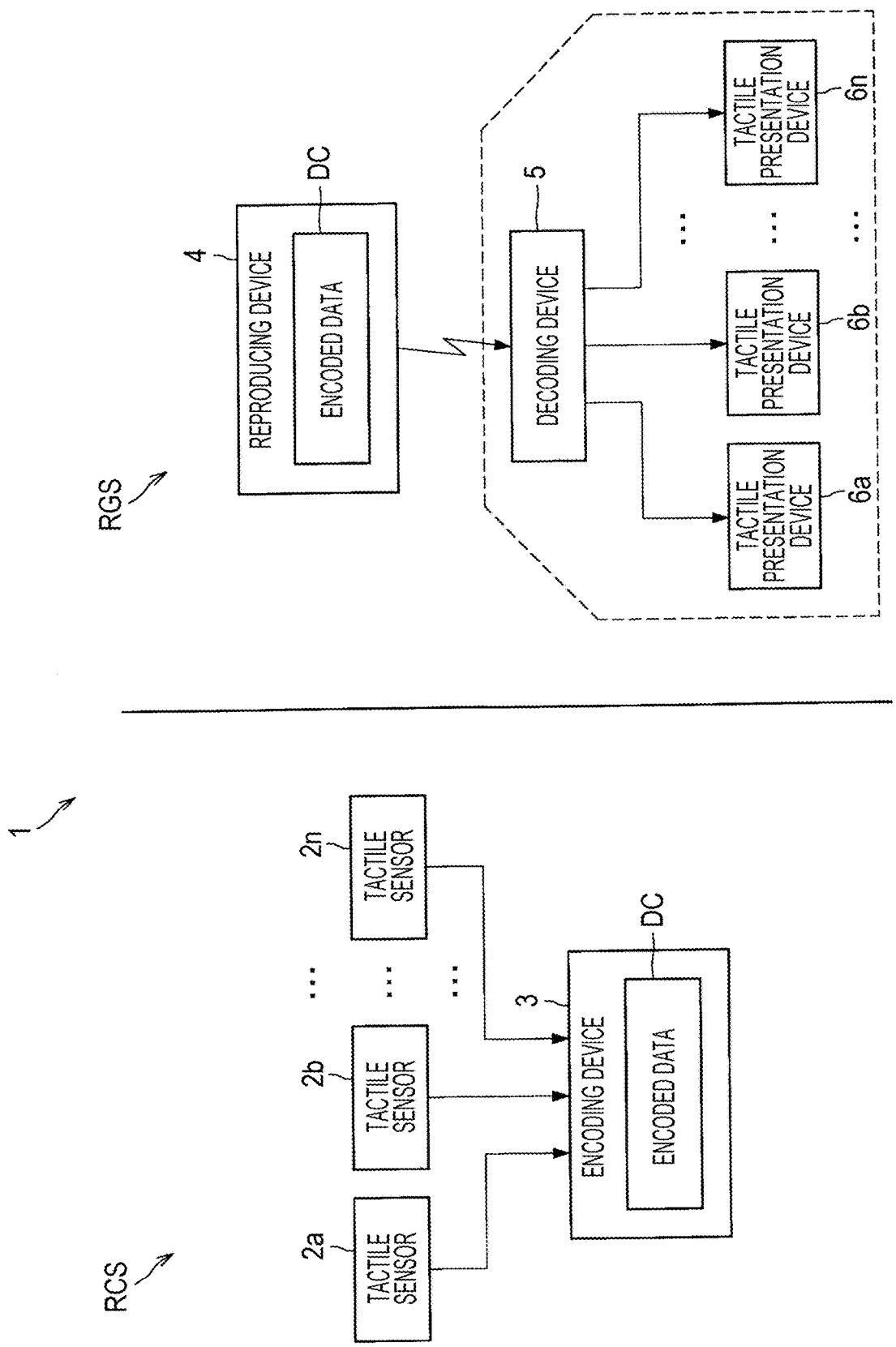
FIG. 2 is a diagram for describing an overview of a tactile presentation system 1 according to the embodiment.

Next, an overview of a tactile presentation system 1 will be described with reference to FIG. 2. FIG. 2 is a diagram for describing the overview of the tactile presentation system 1 according to the present embodiment. The tactile presentation system 1 includes the tactile recording system RCS and the tactile reproducing system RGS.

The tactile recording system RCS records vibrations and movements as tactile signals TS, performs an encoding process and various processes on the tactile signals TS, and generates transmission and reception data TD. Here, the transmission and reception data TD includes various information necessary for generating encoded data DC and the tactile signal TS. Details of the various information necessary for generating the encoded data DC and the tactile signal TS will be described later. The tactile recording system RCS includes a tactile sensor 2 and an encoding device 3.

The tactile sensor 2 is a sensor that senses a tactile stimulus and acquires a tactile signal TS as a voltage change. The tactile sensor 2 is installed in a recording target of the tactile stimulus. For example, the tactile sensor 2 is installed in contact with a predetermined part of a human body, in a case where a movement of the human body is the recording target. It is to be noted that the tactile sensor 2 includes a vibration sensor, for example, a piezo pickup, an acceleration sensor, or the like. As shown in FIG. 2, in a case where tactile stimuli on a plurality of parts that are recording targets are sensed, a plurality of tactile sensors 2a to 2n may be installed on the recording targets.

The encoding device 3 generates transmission and reception data TD on the basis of the tactile signal TS that has been acquired by the tactile sensor 2. Specifically, the encoding device 3 converts and encodes the tactile signal TS that has been acquired by the tactile sensor 2 according to a predetermined data format, and generates the transmission and reception data TD. It is to be noted that the encoding device 3 includes a central processing unit (CPU), a digital signal processor (DSP), or the like.

The tactile reproducing system RGS generates a tactile signal TS on the basis of the transmission and reception data TD that has been received from the encoding device 3. The tactile reproducing system RGS includes a reproducing device 4, a decoding device 5, and a tactile presentation device 6.

The reproducing device 4 receives the transmission and reception data TD from the encoding device 3, and transmits the transmission and reception data TD to the decoding device 5. The reproducing device 4 includes a CPU, a DSP, or the like.

The decoding device 5 generates a tactile signal TS from the transmission and reception data TD that has been received from the reproducing device 4. Specifically, the decoding device 5 performs a decoding process and various processes on the transmission and reception data TD that has been received from the reproducing device 4 to generate a tactile signal TS.

The tactile presentation device 6 is a device that generates a tactile stimulus. It is to be noted that the tactile presentation device 6 includes a vibration device, for example, a vibrator, an actuator, or the like. It is to be noted that as shown in FIG. 2, in a case where the tactile signals TS corresponding to a plurality of parts are present, a plurality of tactile presentation devices 6a to 6n may be installed on a target user to whom the tactile stimuli are given. For example, the tactile presentation device 6 gives tactile stimuli using the tactile signals TS respectively corresponding to the plurality of parts of a human body, so that the vibrations and movements that have been acquired by the tactile sensor 2 are reproduced.

It is to be noted that the decoding device 5 and the tactile presentation device 6 can be connected by cable connection. In such a case, for example, the user may wear the decoding device 5 and the tactile presentation device 6. Further, the decoding device 5 may have a function of the reproducing device 4. On the other hand, whether or not the functions of the decoding device 5 and the reproducing device 4 are included in the same device may be determined depending on the number of the parts to which the tactile stimuli are respectively given.

Heretofore, the overview of the configuration of the tactile presentation system 1 has been described. In this manner, the tactile presentation system 1 is capable of transmitting the tactile sensation that can be perceived at the part onto which the tactile sensor 2 is attached to the tactile presentation device 6, and the tactile presentation device 6 is capable of conveying the tactile sensation to the user.

2.2. Functional Configuration Example

[2.2.1. Functional Configuration Example of Encoding Device 3]

Figure 3:
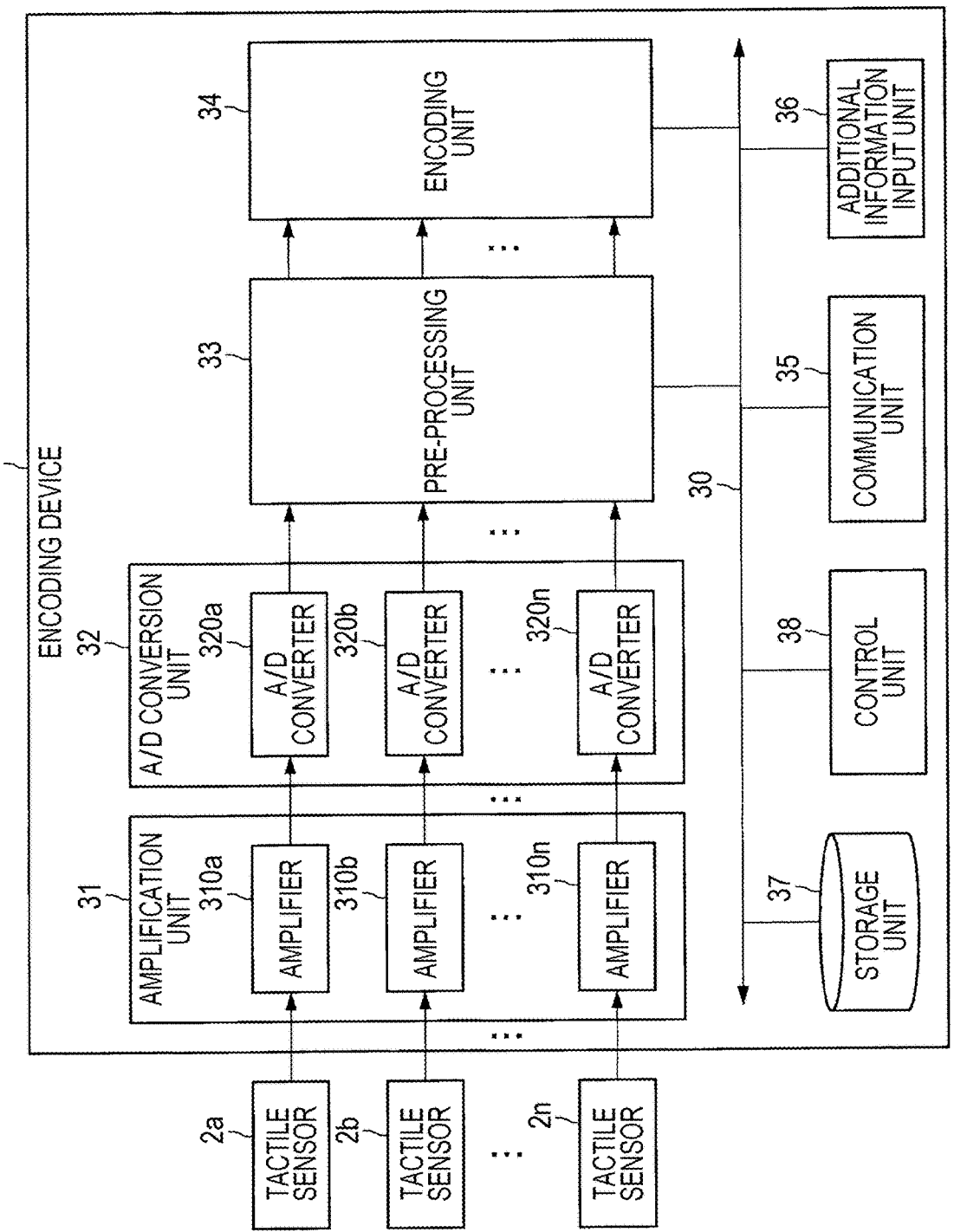
FIG. 3 is a diagram for describing an example of a functional configuration of an encoding device 3 according to the embodiment.

Subsequently, an example of a functional configuration of the encoding device 3 according to the present embodiment will be described. FIG. 3 is a diagram for describing an example of the functional configuration of the encoding device 3 according to the present embodiment. As shown in FIG. 3, the encoding device 3 includes an amplification unit 31, an A/D conversion unit 32, a pre-processing unit 33, an encoding unit 34, a communication unit 35, an additional information input unit 36, a storage unit 37, and a control unit 38.

The amplification unit 31 performs a process of adjusting the tactile signal TS that has been transmitted from the tactile sensor 2 to be an appropriate dynamic range using an amplifier 310. In a case where a plurality of tactile signals TS is present, the amplification unit 31 performs a dynamic range adjusting process using amplifiers 310a to 310n respectively corresponding to the tactile sensors 2a to 2n.

The A/D conversion unit 32 converts an analog signal that has been transmitted from the amplification unit 31 into a digital signal using an A/D converter 320. In a case where the plurality of tactile signals TS is present, the A/D conversion unit 32 performs a process of respectively converting the analog signals into digital signals using the A/D converters 320a to 320n.

The pre-processing unit 33 performs various digital signal processes, such as noise removal, calibration of sensor characteristics of the tactile sensor 2, or the like, on the digital signal that has been converted by the A/D conversion unit 32.

The encoding unit 34 performs various processes and an encoding process on the tactile signal TS that has been processed by the pre-processing unit 33 according to a predetermined data format, and generates transmission and reception data TD. Details of the function of the encoding unit 34 will be described later.

The communication unit 35 communicates with an external device via a network such as the Internet or the like. For example, the communication unit 35 transmits the transmission and reception data TD that has been generated by the encoding unit 34 to the reproducing device 4.

The additional information input unit 36 recognizes identification information to be input from an external device. The additional information input unit 36 links the identification information that has been recognized with the tactile signal TS input from the tactile sensor 2. Details of the function of the additional information input unit 36 will be described later.

The storage unit 37 stores information regarding the various processes performed by the encoding device 3. The storage unit 37 may store, for example, the transmission and reception data TD that has been generated by the encoding unit 34. It is to be noted that the storage unit 37 includes, for example, a hard disk drive (HDD), a solid state drive (SSD), or the like.

The control unit 38 controls the respective functions of the encoding device 3. It is to be noted that the control unit 38 includes, for example, a CPU, random access memory (RAM), read only memory (ROM), or the like.

Incidentally, the pre-processing unit 33, the encoding unit 34, the communication unit 35, the additional information input unit 36, the storage unit 37, and the control unit 38 are connected with one another via a bus 30, and are capable of communicating with one another.

[2.2.2. Functional Configuration Example of Encoding Unit 34]

Figure 4:
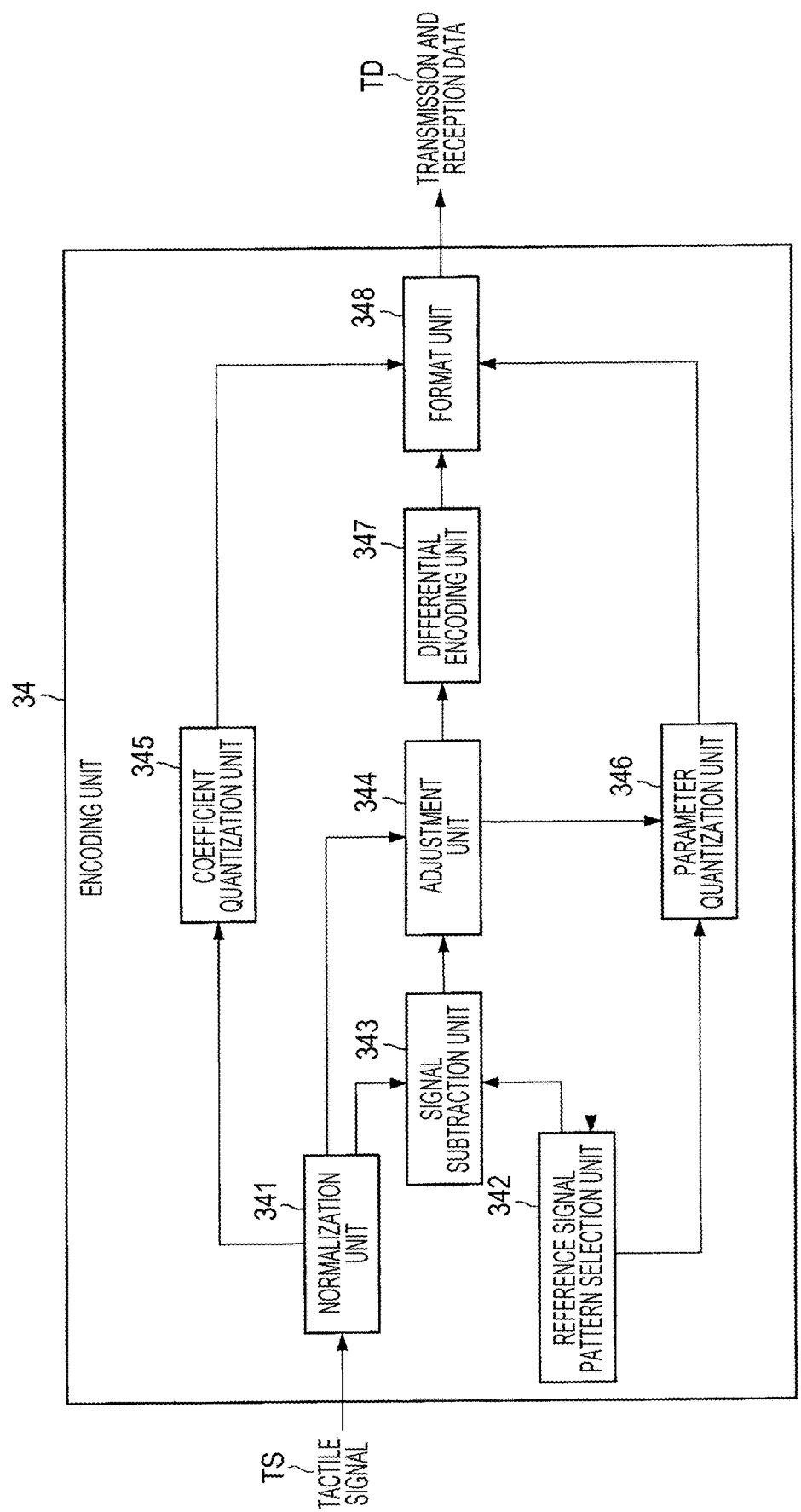
FIG. 4 is a diagram for describing an example of a functional configuration of an encoding unit 34 according to the embodiment.

Here, an example of a functional configuration of the encoding unit 34 will be described with reference to FIG. 4. FIG. 4 is a diagram for describing an example of the functional configuration of the encoding unit 34 according to the present embodiment. The encoding unit 34 includes a normalization unit 341, a reference signal pattern selection unit 342, a signal subtraction unit 343, an adjustment unit 344, a coefficient quantization unit 345, a parameter quantization unit 346, a differential encoding unit 347, and a format unit 348.

The normalization unit 341 cuts out a segment from a rising edge of the tactile signal TS to an attenuation lower limit (an output value is near zero), and normalizes the amplitude for the segment. The tactile stimulus often occurs for a short period of time for a predetermined scene. Therefore, by cutting out a segment to the attenuation lower limit, a more efficient process can be performed. Further, here, the normalization of the amplitude means adjustment of a gain so that a maximum value of the amplitude of the tactile signal TS becomes a maximum amplitude of a quantized bit length of the tactile signal TS.

A normalization coefficient SF (an adjustment value) can be obtained from Expression (2) in a case where Amax represents a maximum value of the amplitude of the tactile signal TS and Rmax represents a maximum amplitude of the quantized bit length of the tactile signal TS. The normalization coefficient SF is used in a process performed by the decoding device 5.

[Expression 2]

$$SF = |A_{max}|/|R_{max}| \qquad (2)$$

For example, the maximum amplitude Rmax of the quantized bit length is 2048 (a dimensionless number), in a case where the quantized bit depth of the tactile signal TS is 12 bits.

Here, an example of a normalization process by the normalization unit 341 will be described with reference to FIG. 5. FIG. 5 is a diagram for describing an example of the normalization process by the normalization unit 341 according to the present embodiment. FIG. 5 shows a tactile signal TS1 before normalization and a tactile signal TS2 after normalization. The normalization unit 341 adjusts the gain so that a maximum value Amax1 of the amplitude of the tactile signal TS1 becomes the maximum amplitude Rmax1 of the quantized bit length. That is, the normalization unit 341 generates a tactile signal TS2 having the maximum value Rmax1 of the amplitude, which is the same with the maximum amplitude of the quantized bit length, on the basis of the tactile signal TS1 having the maximum value Amax1 of the amplitude.

Referring back to FIG. 4, the functional configuration of the encoding unit 34 will be described. The reference signal pattern selection unit 342 selects a pattern of a reference signal SS, and generates the reference signal SS according to the pattern that has been selected. Here, the reference signal SS denotes a signal, a waveform of which is supposed to be similar to the waveform of the tactile signal TS. Specifically, the reference signal SS denotes a signal in which the data length of the transmission and reception data TD becomes shorter, in a case where variable length encoding is performed on the signal that is a differential from the tactile signal TS (hereinafter, referred to as a differential signal DS). The reference signal pattern selection unit 342 may select a signal having a smaller differential from the tactile signal TS.

The reference signal pattern selection unit 342 may further determine a parameter corresponding to a reference signal pattern that has been selected, and may generate the reference signal SS on the basis of the parameter that has been determined. Further, in a case where a plurality of reference signal patterns is present or in a case where a plurality of parameters corresponding to the reference signals SS can be set, the reference signal pattern selection unit 342 may generate a plurality of candidate signals for the reference signals SS on the basis of the respective reference signal patterns or parameters corresponding to the patterns. It is to be noted that the reference signal SS may be determined from a plurality of candidate signals by the adjustment unit 344, as will be described later.

Hereinafter, the reference signal patterns and the corresponding parameters will be described with reference to specific examples.

(Reference Signal Pattern 1)

Figure 6:
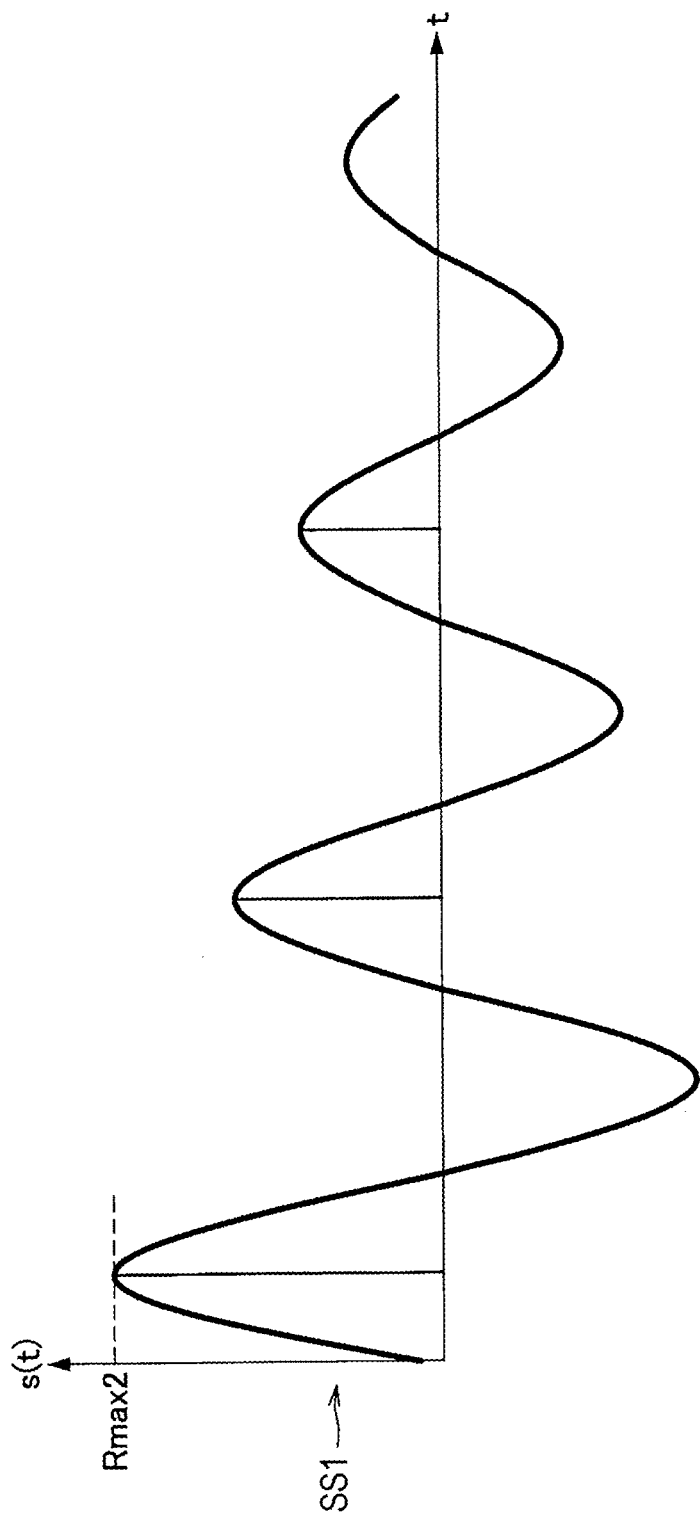
FIG. 6 is a diagram for describing an example in a case where a reference signal pattern according to the embodiment is an attenuated sinusoidal signal.

First, as a reference signal pattern, an attenuated sinusoidal signal can be mentioned. The attenuated sinusoidal signal is suitable as a signal for conveying a simple tactile sensation. Here, an example of the attenuated sinusoidal signal will be described with reference to FIG. 6. FIG. 6 is a diagram for describing an example in a case where the reference signal pattern according to the present embodiment is an attenuated sinusoidal signal.

FIG. 6 shows a reference signal SS1, which is the attenuated sinusoidal signal. The reference signal SS1 is a signal in which Rmax2 represents a maximum value of a first amplitude, and is gradually attenuated as the time elapses. The gradually attenuated sinusoidal vibration indicated by the reference signal SS1 is a vibration representing a situation in which an object receives an impact, and the impact is gradually attenuated from the impacted part and propagates to other parts. Therefore, it is supposed that the reference signal SS1 has a high correlation with a tactile sensation that receives a similar impact.

A typical attenuated sinusoidal signal is represented by Expression (3). In Expression (3), r(t) represents a signal value at a sampling time, λ represents a coefficient indicating an attenuation rate, and ω represents a frequency of a sine wave.

[Expression 3]

$$r(t) = e^{-\lambda t} \sin 2\pi\omega t \qquad (3)$$

In addition, the attenuated sinusoidal signal that has been normalized so that the maximum value of the amplitude of the signal at a rising edge is the maximum amplitude of the quantized bit length (Rmax2 in FIG. 6) is represented by Expression (4).

[Expression 4]

$$r(t) = e^{-4\omega t \ln Rmax2} \sin 2\pi\omega t \qquad (4)$$

The parameters corresponding to a reference signal pattern 1 include a frequency F1 (the unit is Hz) of the attenuated sinusoidal signal, a duration T1 (the unit is the number of samples in time) of the attenuated sinusoidal signal, and a phase P1 (the unit is the number of samples in time) of the attenuated sinusoidal signal.

Figure 7:
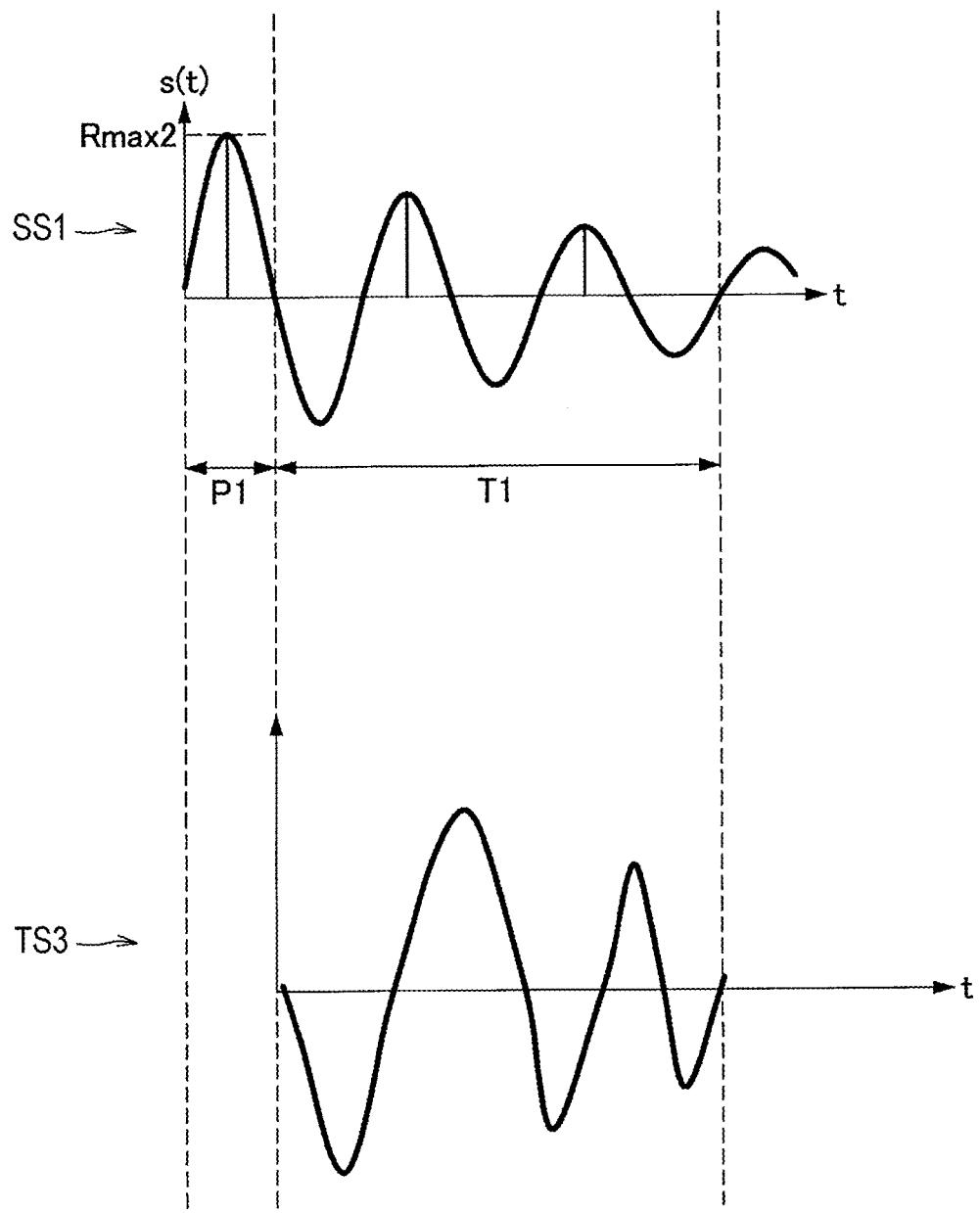
FIG. 7 is a diagram for describing an example of a parameter in a case where the reference signal pattern according to the embodiment is the attenuated sinusoidal signal.

Here, a specific example of the parameters corresponding to the reference signal pattern 1 will be described with reference to FIG. 7. FIG. 7 is a diagram for describing an example of the parameters in a case where the reference signal pattern according to the present embodiment is an attenuated sinusoidal signal. FIG. 7 shows the reference signal SS1 and a tactile signal TS3. Here, the reference signal SS1 is a signal having the duration of T1 and a phase shifted by P1 on the basis of the tactile signal TS3. In this manner, the reference signal pattern selection unit 342 is capable of generating a signal having a smaller differential from the tactile signal TS on the basis of the parameters corresponding to the reference signal pattern 1.

(Reference Signal Pattern 2)

Additionally, as a reference signal pattern, a sampling signal can also be mentioned. By the way, the tactile stimulus conveyed to a user may differ depending on the scene (situation) in which the tactile presentation is given. However, the type of the tactile stimulus in a single scene is highly likely a determined one to some extent. By limiting the type of an experience (a tactile experience) in which the tactile stimulus is given for every scene, and setting the signal that has been sampled beforehand for every limited tactile experience as the reference signal SS, the reference signal SS and the tactile signal TS are more likely to be similar to each other.

A specific example will be described with reference to FIG. 8. FIG. 8 is a diagram for describing an example in a case where a reference signal pattern according to the present embodiment is a sampling signal. FIG. 8 shows a table TA including information regarding a plurality of scenes and tactile experiences corresponding to the respective scenes.

As shown in FIG. 8, an ID is assigned to each of the plurality of scenes, and in addition, an ID is assigned to each of the tactile experiences corresponding to the respective scenes. In a case where identification information (ID) is input by the additional information input unit 36 described above, the reference signal pattern selection unit 342 selects a sampled signal of the tactile experience corresponding to the ID that has been input, as a reference signal SS or a candidate signal for the reference signal SS.

An example of FIG. 8 will be described. A scene with a scene ID of "1" is "soccer", and a tactile experience with a tactile experience ID of "0" is "a feeling of a foot at the time of kicking a ball". In a case where a sampling signal is selected as the reference signal pattern and the scene ID of "1" and the tactile experience ID of "0" are selected, the tactile signal TS including a vibration for giving "a feeling of a foot at the time of kicking a ball" becomes the reference signal SS or a candidate signal for the reference signal SS.

The parameters corresponding to a reference signal pattern 2 include scene identification information IDs (a dimensionless number), tactile experience identification information IDh (a dimensionless number), and a duration T2 of the sampling signal (the unit is the number of samples in time).

Figure 9:
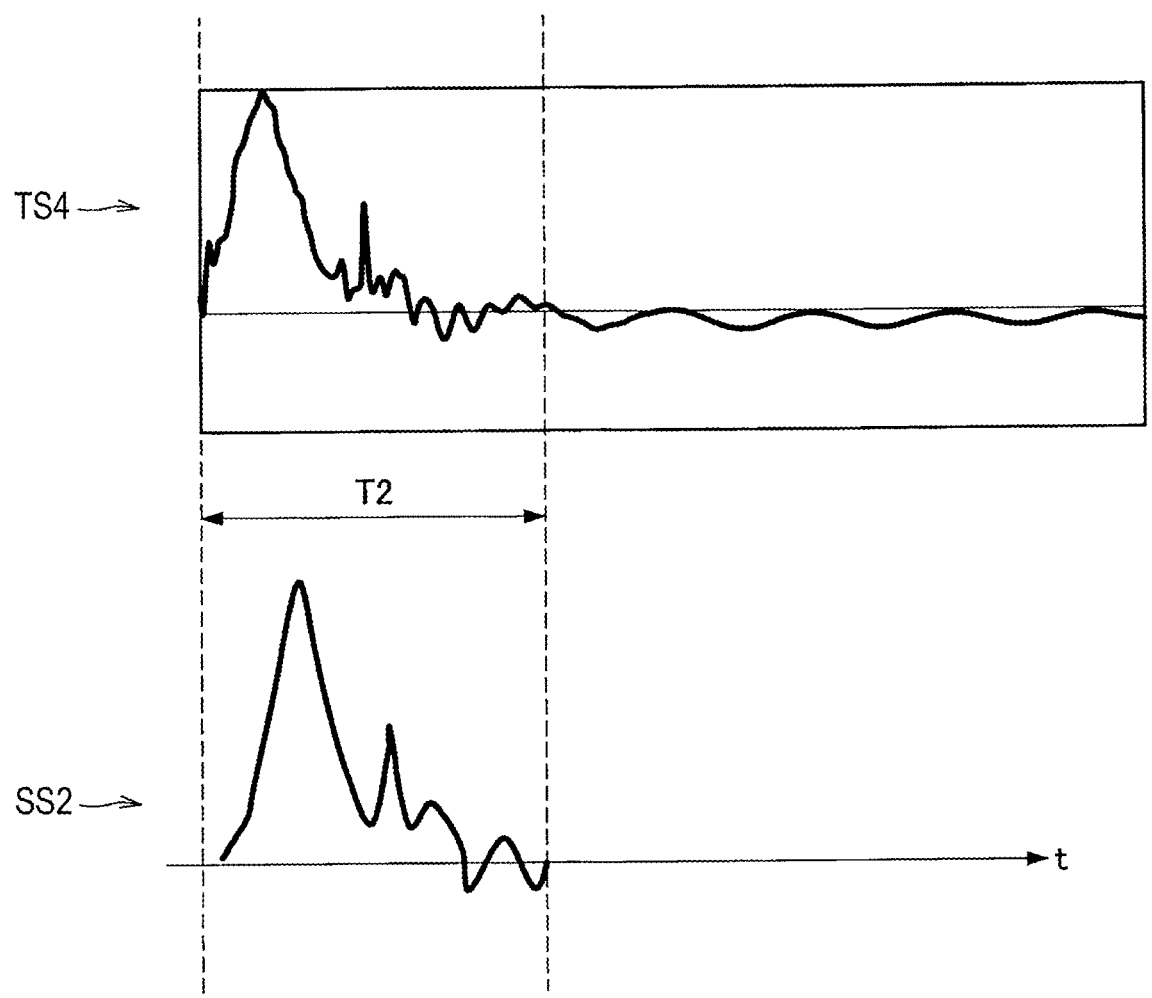
FIG. 9 is a diagram for describing an example of a parameter in a case where the reference signal pattern according to the embodiment is the sampling signal.

Here, the parameters corresponding to the reference signal pattern 2 will be described with reference to FIG. 9. FIG. 9 is a diagram for describing an example of the parameters in a case where the reference signal pattern according to the present embodiment is a sampling signal. FIG. 9 shows a tactile signal TS4 and a reference signal SS2. Here, the duration T2 of the reference signal SS2 is similar to a rising period of the tactile signal TS4.

It is to be noted that the signal that has been sampled beforehand may be a signal obtained by averaging the signals that have been recorded a plurality of times. The table TA may be created on the basis of categorization by conducting machine learning on the signal that has been input into the encoding unit 34.

(Reference Signal Pattern 3)

Furthermore, as a reference signal pattern, the tactile signal TS of any part of the user's body can be mentioned. As a predetermined type of vibration like ground swaying, there is a vibration that propagates from a predetermined part of the user's body to another part. Here, the waveform of the vibration after the propagation can be similar to the waveform of the vibration before the propagation. Therefore, the tactile signal TS of any part of the user may be suitable as the reference signal SS. The correlation between the tactile signal TS of another part and the reference signal SS is enhanced by setting the tactile signal TS of any one of a plurality of parts to the reference signal SS.

Figure 10:
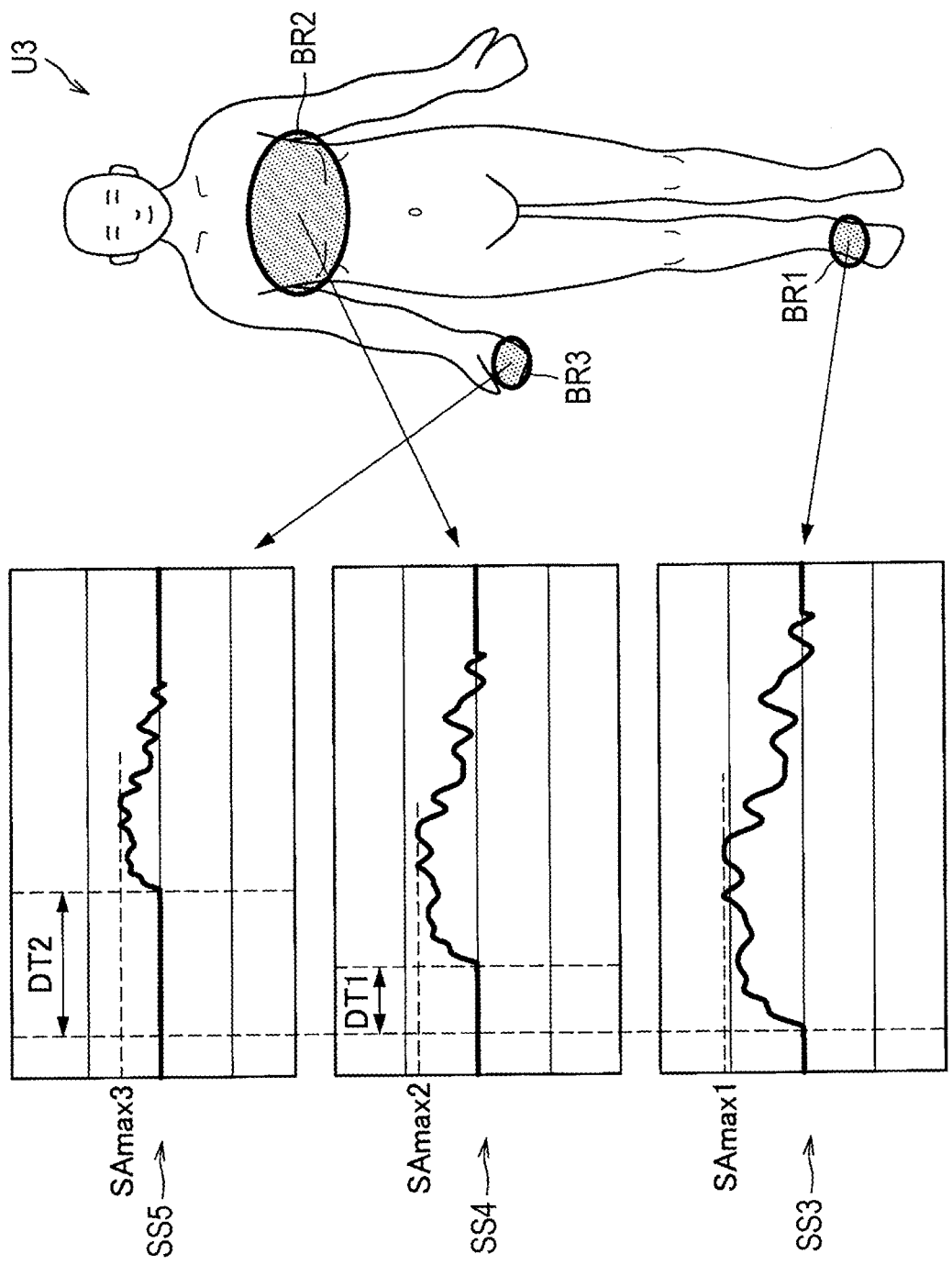
FIG. 10 is a diagram for describing an example in which the reference signal pattern according to the embodiment is the tactile signal TS of any of parts.

A specific example will be described with reference to FIG. 10. FIG. 10 is a diagram for describing an example in which the reference signal pattern according to the present embodiment is the tactile signal TS of any part. FIG. 10 shows parts BR1 to BR3 of a user U3 and respectively corresponding reference signals SS3 to SS5.

For example, in a case where the ground swaying occurs, in general, feet that are in contact with the ground vibrate first, the vibrations of the feet propagate and cause the body to vibrate, and lastly the vibrations are conveyed to hands. In such a case, the reference signal pattern selection unit 342 may determine the vibration conveyed to a foot, that is, the tactile signal TS of the foot as the reference signal SS. In addition, the reference signal pattern selection unit 342 may determine that the reference signal SS of another part is a signal in which the reference signal SS of the foot has been attenuated.

An example of FIG. 10 will be described. A reference signal SS3 of the foot BR1 is a signal similar to the tactile signal TS of the foot. A reference signal SS4 of the body BR2 is a signal that the tactile signal TS (the reference signal SS) of the foot BR1 is attenuated to an amplitude SAmax2 and is generated with a delay by a predetermined time DT1. In a similar manner, a reference signal SS5 of the hand BR3 is a signal that the tactile signal TS (the reference signal SS) of the foot BR1 is attenuated to an amplitude SAmax3 and is generated with a delay by a predetermined time DT2.

The parameters corresponding to a reference signal pattern 3 include channel identification information IDp (a dimensionless number) of a part where the tactile sensation is felt firstly, a vibration start time difference DT (the unit is the number of samples in time) from the part where the tactile sensation is felt firstly, and an amplitude rate SF3 (a dimensionless number) with respect to an amplitude of the part where the tactile sensation is felt firstly. The amplitude rate SF3 may be determined on the basis of a relationship between the part where the tactile sensation is first felt and a predetermined part, or may be determined on the basis of the vibration start time difference DT.

It is to be noted that a reference signal generation unit 542 may not necessarily generate the reference signal SS, the amplitude of which is equal to or smaller than a predetermined value in the reference signal pattern 3. Alternatively, the reference signal generation unit 542 may not necessarily generate the reference signal SS corresponding to a part among the parts of the user's body that is not supposed to affect the tactile experience because the influence of the vibration is small, in the reference signal pattern 3. Further, the encoding unit 34 may not necessarily transmit the tactile signal TS corresponding to the above-described part to the reproducing device 4.

Heretofore, the specific examples of the reference signal patterns have been described. The reference signal pattern selection unit 342 may generate a signal as a candidate signal for the reference signal SS on the basis of the above-described reference signal pattern and the corresponding parameter. The reference signal pattern selection unit 342 transmits the candidate signal that has been generated to the signal subtraction unit 343, as will be described later.

The reference signal pattern selection unit 342 may generate candidate signals for the reference signal SS on the basis of all the reference signal patterns that can be stored in the encoding device 3. By generating the candidate signals for the reference signal SS that can be generated by the reference signal pattern selection unit 342, a more suitable signal can be determined as the reference signal SS.

On the other hand, the reference signal pattern selection unit 342 may generate a candidate signal for the reference signal SS on the basis of any reference signal pattern of the plurality of reference signal patterns. For example, in a case where the waveform of the tactile signal TS is predictable to some extent, the reference signal pattern selection unit 342 may select any reference signal pattern according to the prediction, and may generate a candidate signal for the reference signal SS on the basis of the reference signal pattern that has been selected. In this manner, in a case where the waveform of the tactile signal TS is predictable, by limiting of the reference signal pattern to be selected, a high-speed process of the entire encoding unit 34 is realized.

Further, on the other hand, the reference signal pattern selection unit 342 may select the reference signal pattern in consideration of a congestion state of network communication. For example, in a case where it is supposed that the possibility of a communication delay is increasing on the basis of the congestion state of the network communication, the reference signal pattern selection unit 342 may limit the reference signal pattern to be selected, according to the priority of each reference signal pattern. In this manner, by generating the reference signal in consideration of the congestion state of the network communication, the prevention of a delay in the communication is enabled in a more efficient manner.

The reference signal pattern selection unit 342 generates the signal, and then transmits to the parameter quantization unit 346, the identification information and parameter of the reference signal pattern that has been selected. Here, the identification information of the reference signal pattern may be a reference signal pattern ID. For example, in the specific examples of the reference signal patterns described above, a reference signal pattern ID1 is assigned to the reference signal pattern 1, a reference signal pattern ID2 is assigned to the reference signal pattern 2, and a reference signal pattern ID3 is assigned to the reference signal pattern 3.

A description will be given by referring back to FIG. 4.

The signal subtraction unit 343 does a subtraction between the tactile signal TS that has been normalized by the normalization unit 341 and the reference signal SS that has been generated by the reference signal pattern selection unit 342, and generates a differential signal DS, which is a result of the subtraction. In a case where a plurality of candidate signals for the reference signal SS is present, the signal subtraction unit 343 does a subtraction between the tactile signal TS and the candidate signal, and generates the differential signal DS, which is a result of the subtraction.

The adjustment unit 344 calculates energy of the differential signal DS that has been generated by the signal subtraction unit 343. In a case where a plurality of differential signals DS is transmitted from the signal subtraction unit 343, the adjustment unit 344 determines that a candidate signal corresponding to the differential signal DS having smaller energy than those of the other differential signals DS among the plurality of differential signals DS is the reference signal SS, and transmits the differential signal DS to the differential encoding unit 347. For example, the adjustment unit 344 may determine that the candidate signal corresponding to the differential signal DS having the smallest energy among the plurality of differential signals DS is the reference signal SS. Further, the adjustment unit 344 calculates the energy of the differential signal DS, and determines that the signal having a small differential in amplitude, phase, and duration is the reference signal SS. In this manner, by determining that the signal corresponding to the differential signal DS, the energy of which is smaller than those of the other differential signals DS, is the reference signal SS, improvement in the compression effect of data in the variable length encoding is enabled.

It is to be noted that the energy of the differential signal DS is calculated by Expression (5).

[Expression 5]

$$E(i, p) = \sum_{t=0}^{N} \{r(i, p, t) - s(t)\}^2 \quad (5)$$

Here, i represents an ID of the reference signal pattern, p represents a parameter corresponding to the reference signal pattern, t represents a sampling time, N represents a duration of the reference signal SS and the tactile signal TS (the unit is the number of samples in time), r(i, p, t) represents an amplitude of the reference signal SS, s(t) represents an amplitude of the tactile signal TS after preprocess, and E(i, p) represents the energy of the differential signal DS.

The coefficient quantization unit 345 quantizes the normalization coefficient SF that has been calculated by the normalization unit 341 to a predetermined bit depth.

The parameter quantization unit 346 quantizes the identification information of the reference signal pattern that has been transmitted from the reference signal pattern selection unit 342 and the corresponding parameter to a predetermined bit depth.

The differential encoding unit 347 performs the variable length encoding on the differential signal DS that has been transmitted from the adjustment unit 344. The variable length encoding is, for example, Huffman coding, Golomb-Rice coding, or the like. It is to be noted that in a case of the reference signal pattern ID3 (the tactile signal TS of any part), the differential encoding unit 347 may transmit the reference signal SS itself to the format unit 348 without conducting the variable length encoding on the differential signal DS on a channel where the tactile signal TS is the reference signal SS.

The format unit 348 generates transmission and reception data TD on the basis of the normalization coefficient SF, the parameter of the reference signal SS, and the differential signal DS that has been encoded. The transmission and reception data TD includes parameters of the encoded data DC, the normalization coefficient SF, and the reference signal SS. Specifically, the format unit 348 arranges the normalization coefficient SF, the parameter of the reference signal SS, and the differential signal DS that has been encoded, in a bit sequence according to a predetermined frame format, and generates the transmission and reception data TD for one frame. It is to be noted that the format unit 348 may repeatedly perform the process of arranging in a bit sequence according to a predetermined frame format FF, so as to generate a plurality of frames of the transmission and reception data TD.

Figure 11:
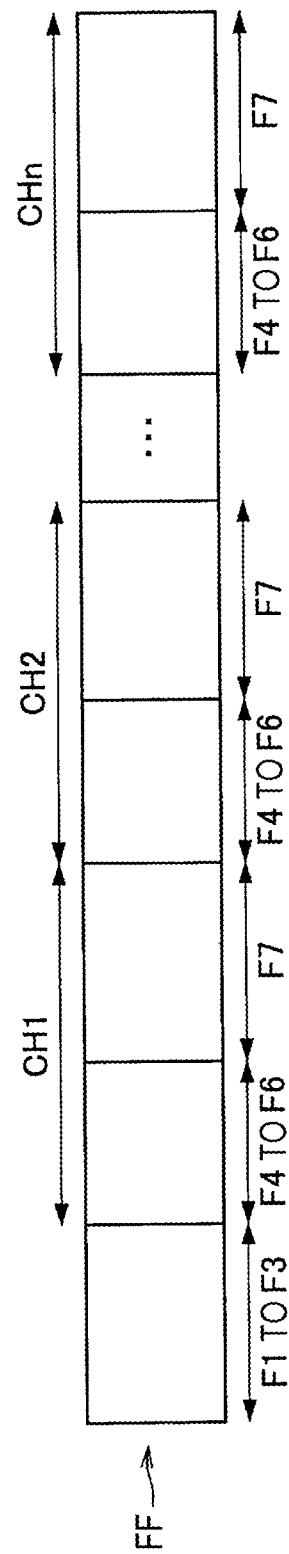
FIG. 11 is a diagram for describing an example of a frame format FF of transmission and reception data TD according to the embodiment.

Here, an example of the frame format FF of the transmission and reception data TD will be described with reference to FIG. 11. FIG. 11 is a diagram for describing an example of the frame format FF of the transmission and reception data TD according to the present embodiment. FIG. 11 shows an example of the frame format FF. FIG. 11 shows the frame format FF including a bit sequence corresponding to signals of channels CH1 to CHn. Formats F1 to F7 are as follows. It is to be noted that in FIG. 11, information corresponding to the sampling frequency and the quantized bit depth of the tactile signal TS is not included because such information is assumed to have a fixed value.

F1 [16 bit]: Sync word (0xFFFE)

F2 [4 bit]: Number of channels CH of the tactile signal TS (one to 16 channels)

F3 [10 bit]: Number of samples of the tactile signal TS decoded in this frame (0 to 1023 samples)

F4 [8 bit]: Quantized normalization coefficient (the adjustment value) of each channel CH SF (256 gradations)

F5 [2 bit]: Reference signal SS pattern ID (three patterns) for each channel CH

F6 [16 bit to 25 bit]: Parameters for every pattern of each reference signal

Pattern 1. Attenuated sinusoidal signal:
        [5 bit]: Quantized F1 (32 patterns)
        [10 bit]: T1 (0 to 1023 samples)
        [10 bit]: P1 (0 to 1023 samples)
    Pattern 2. Sampling signal:
        [3 bit]: IDs (eight scenes)
        [3 bit]: IDh (eight patterns)
        [10 bit]: T2 (0 to 1023 samples)
    Pattern 3. Tactile signal TS on any part of a user's body:
        [obit]: IDp (one to 16 channels)
        [10 bit]: DT (0 to 1023 samples)
        [8 bit]: Quantized SF3 (256 steps)

F7 [- - - - -]: encoded data DC for every channel

[2.2.3. Functional Configuration Example of Reproducing Device 4]

Figure 12:
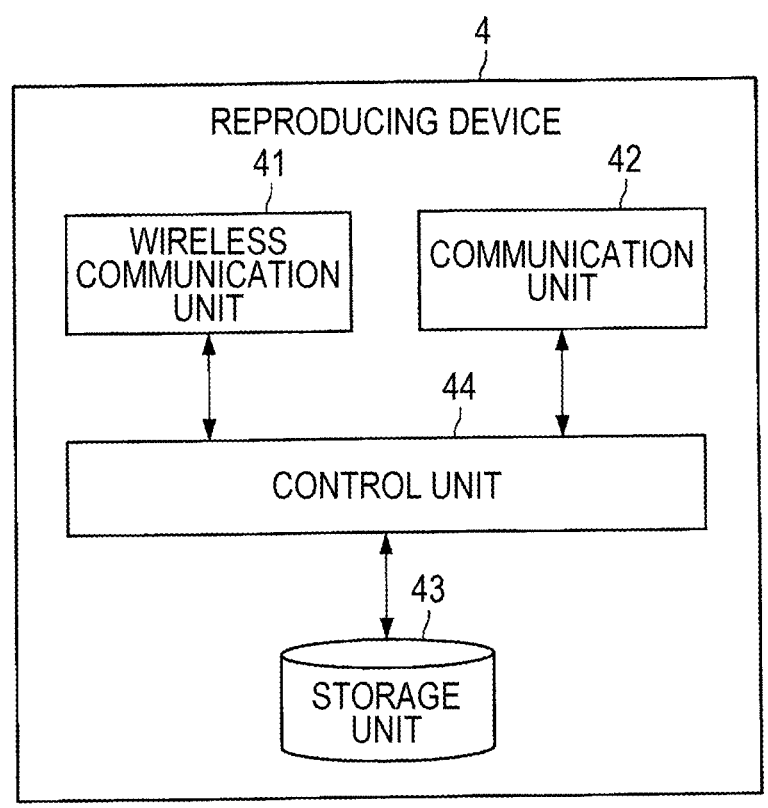
FIG. 12 is a diagram for describing an example of a functional configuration of a reproducing device 4 according to the embodiment.

Subsequently, an example of a functional configuration of the reproducing device 4 according to the present embodiment will be described with reference to FIG. 12. FIG. 12 is a diagram for describing an example of the functional configuration of the reproducing device 4 according to the present embodiment. The reproducing device 4 includes a wireless communication unit 41, a communication unit 42, a storage unit 43, and a control unit 44.

The wireless communication unit 41 transmits the transmission and reception data TD to the decoding device 5. For example, the wireless communication unit 41 may transmit the transmission and reception data TD to the decoding device 5 by using a short-range wireless communication method such as Bluetooth (registered trademark) or the like.

The communication unit 42 communicates with an external device via a network such as the Internet or the like. The communication unit 42 receives, for example, the transmission and reception data TD from the encoding device 3.

The storage unit 43 stores information regarding control of the reproducing device 4 conducted by the control unit 44, as will be described later. It is to be noted that the storage unit 43 includes, for example, an HDD, an SSD, or the like.

Further, the storage unit 43 may include a portable removable recording medium. The storage unit 43 also functions as a reader and writer unit capable of writing into and reading from the recording medium, and is capable of reading the transmission and reception data TD to be recorded in the recording medium. It is to be noted that examples of the recording medium include a memory card such as a portable flash memory, an optical disk recording medium, and the like.

The control unit 44 controls the entire reproducing device 4. It is to be noted that the control unit 44, for example, a reception process of the transmission and reception data TD using the communication unit 42, or it is to be noted that the control unit 44 includes, for example, a CPU, a RAM, a ROM, and the like.

[2.2.4. Functional Configuration Example of Decoding Device 5]

Figure 13:
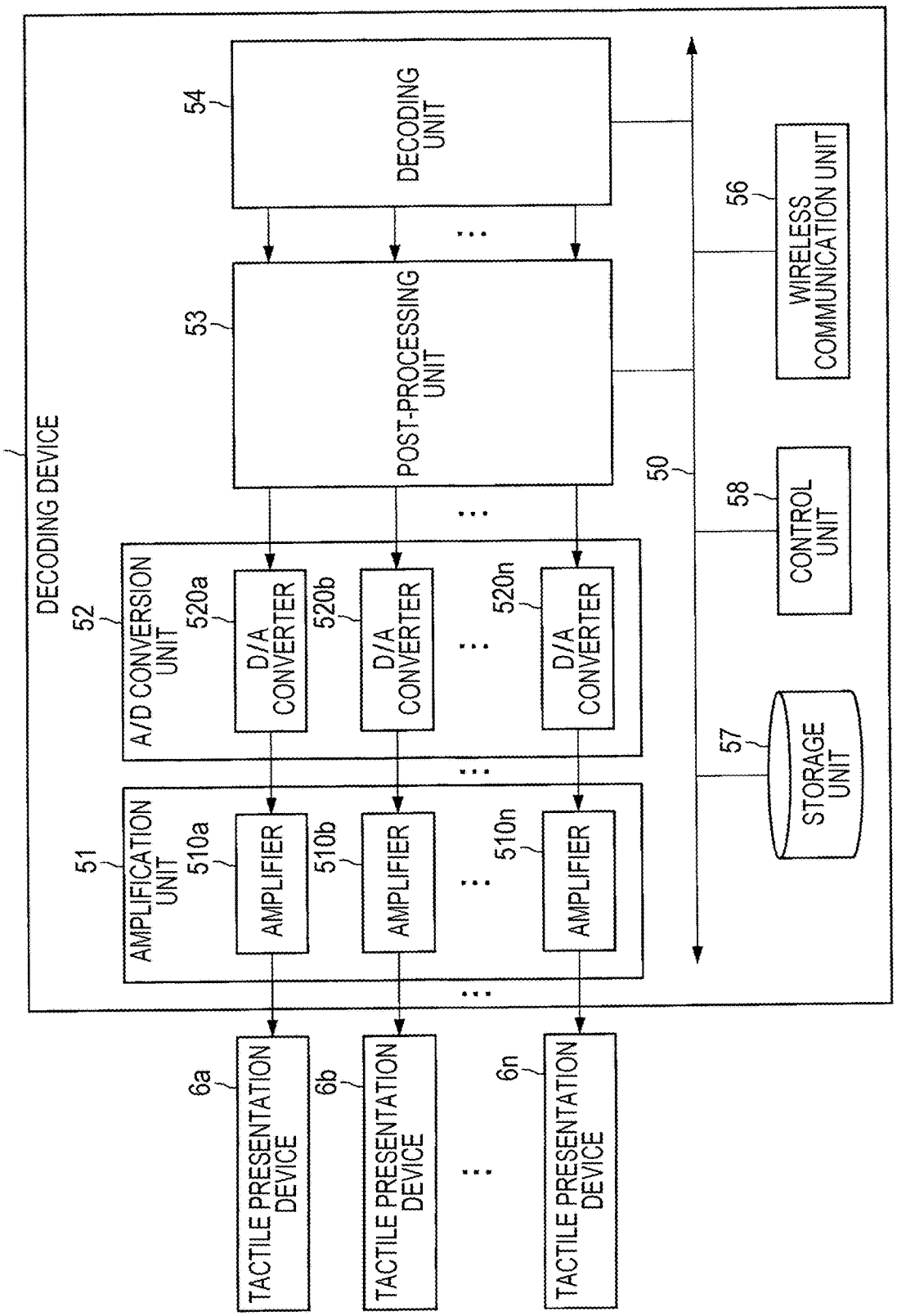
FIG. 13 is a diagram for describing an example of a functional configuration of a decoding device 5 according to the embodiment.

Subsequently, an example of a functional configuration of the decoding device 5 according to the present embodiment will be described with reference to FIG. 13. FIG. 13 is a diagram for describing an example of the functional configuration of the decoding device 5 according to the present embodiment. The decoding device 5 includes an amplification unit 51, a D/A conversion unit 52, a post-processing unit 53, a decoding unit 54, a wireless communication unit 56, a storage unit 57, and a control unit 58.

The amplification unit 51 performs a process of adjusting the tactile signal TS that has been transmitted from the D/A conversion unit 52 to an appropriate dynamic range using the amplifier 510, and transmits the tactile signal TS to the tactile presentation device 6. In a case where a plurality of tactile signals TS is present, the amplification unit 51 performs dynamic range adjustment processes respectively using the corresponding amplifiers 510a to 510n, and transmits the dynamic ranges to the respective tactile presentation devices 6a to 6n.

The D/A conversion unit 52 converts a digital signal that has been transmitted from the post-processing unit 53 into an analog signal using a D/A converter 520. In a case where a plurality of tactile signals TS is present, the D/A conversion unit 52 performs processes of converting the respective analog signals into digital signals using A/D converters 520a to 520n.

The post-processing unit 53 performs signal processes such as a calibration process, a predetermined filter process, and the like related to the tactile presentation device 6.

The decoding unit 54 performs a decoding process and various processes on the transmission and reception data TD that has been generated by the encoding unit 34 of the encoding device 3, so as to generate the tactile signal TS. Details of the function of the decoding unit 54 will be described later.

The wireless communication unit 56 communicates with the wireless communication unit 41 of the reproducing device 4, and receives the transmission and reception data TD. The wireless communication unit 56 receives the transmission and reception data TD by using, for example, a short-range wireless communication method such as Bluetooth (registered trademark) or the like.

The storage unit 57 stores information regarding various processes performed by the decoding device 5, such as information regarding the reference signal or the like. The storage unit 57 stores, for example, the transmission and reception data TD, the tactile signal TS, and information regarding the reference signal SS. It is to be noted that the storage unit 57 includes, for example, an HDD, an SSD, or the like.

The control unit 58 controls each function of the decoding device 5. It is to be noted that the control unit 58 includes, for example, a CPU, a RAM, a ROM, and the like.

It is to be noted that the post-processing unit 53, the decoding unit 54, the wireless communication unit 56, the storage unit 57, and the control unit 58 are connected via the bus 50 with one another, and are capable of performing data communication with one other.

[2.2.5. Functional Configuration Example of Decoding Unit 54]

Figure 14:
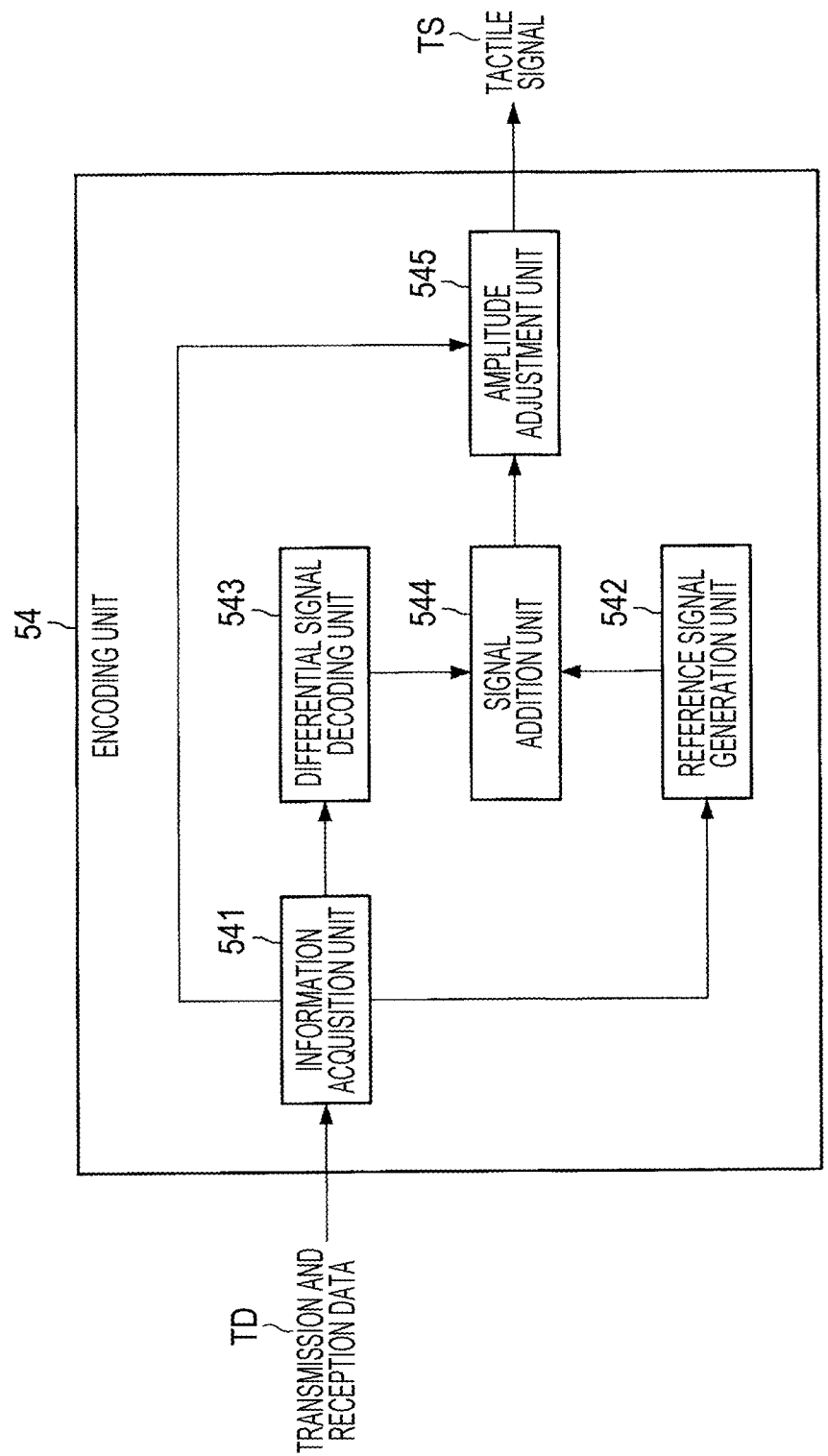
FIG. 14 is a diagram for describing an example of a functional configuration of a decoding unit 54 according to the embodiment.

Here, an example of the functional configuration of the decoding unit 54 will be described with reference to FIG. 14. FIG. 14 is a diagram for describing an example of the functional configuration of the decoding unit 54 according to the present embodiment. The decoding unit 54 includes an information acquisition unit 541, a reference signal generation unit 542, a differential signal decoding unit 543, a signal addition unit 544, and an amplitude adjustment unit 545.

The information acquisition unit 541 acquires various information necessary for generating the tactile signal TS, such as information regarding the encoded data DC, the reference signal, and the like from the transmission and reception data TD that has been input. In the example shown in FIG. 14, the information acquisition unit 541 acquires, for example, the number of channels of a Sync word or the tactile signal TS, the normalization coefficient SF, the reference signal pattern ID, the parameter of the reference signal SS, and the like, on the basis of the frame format FF.

The reference signal generation unit 542 generates the reference signal SS on the basis of the information regarding the reference signal SS. The information regarding the reference signal SS is, for example, a reference signal pattern and a corresponding parameter. The reference signal generation unit 542 identifies the reference signal pattern from the reference signal pattern ID, and generates the reference signal SS by using the parameter corresponding to the reference signal pattern that has been identified. The reference signal pattern may be shared with the encoding unit 34.

It is to be noted that the reference signal SS generated by the reference signal generation unit 542 is a signal having a smaller differential from the tactile signal TS than candidate signals for the other reference signals SS. Further, the reference signal SS generated by the reference signal generation unit 542 may be a signal having a smaller differential in amplitude, phase, and duration from the tactile signal TS than the other candidate signals. Further, the reference signal SS generated by the reference signal generation unit 542 may be a signal having a smaller differential in energy from the tactile signal TS than the other candidate signals.

The generation of the reference signal SS using the reference signal generation unit 542 will be described for every specific example of the reference signal patterns described above. In the case of the reference signal pattern 1 (an attenuated sinusoidal signal), the reference signal generation unit 542 generates an attenuated sinusoidal signal having a frequency, a phase, and a duration indicated by the parameters of the reference signal SS, on the basis of the parameters indicating the frequency, the phase, and the duration of the attenuated sinusoidal signal. Specifically, the reference signal generation unit 542 generates the reference signal SS on the basis of Expression (4), the frequency F1, the duration T1, and the phase P1 of the attenuated sinusoidal signal.

In the case of the reference signal pattern 2 (a sampling signal), the reference signal generation unit 542 selects a signal on the basis of the parameter corresponding to a predetermined scene. Further, the reference signal generation unit 542 may generate the reference signal SS on the basis of the identification information corresponding to the predetermined scene and the duration of the reference signal SS. Specifically, the reference signal generation unit 542 selects a corresponding signal on the basis of the scene identification information IDs and the tactile experience identification information IDh, and generates the reference signal SS on the basis of the signal that has been selected and the duration T2.

In the case of the reference signal pattern 3 (a tactile signal TS of any part of a user's body), the reference signal generation unit 542 generates the reference signal SS on the basis of the parameter indicating that the reference signal SS corresponds to which tactile signal TS among the plurality of tactile signals TS. Further, the reference signal generation unit 542 may generate the reference signal SS in which the tactile signal TS has been attenuated at an attenuation rate, further on the basis of information indicating which tactile signal TS and a parameter indicating the attenuation rate with respect to the tactile signal TS. Specifically, the reference signal generation unit 542 identifies the channel of the tactile signal TS to be the reference signal on the basis of the channel identification information IDp of the part where the tactile sensation is felt firstly, and generates the reference signal SS on the basis of the tactile signal TS that has been identified and the vibration start time difference DT and the amplitude rate SF3.

The differential signal decoding unit 543 decodes the encoded data DC, and acquires the differential signal DS. Specifically, the differential signal decoding unit 543 performs a decoding process on the variable length encoding that has been performed by the differential encoding unit 347 of the encoding unit 34, and acquires the differential signal DS.

The signal addition unit 544 adds the reference signal SS that has been generated by the reference signal generation unit 542 and the differential signal DS that has been generated by the differential signal decoding unit 543, and generates the tactile signal TS that has been normalized. That is, the signal addition unit 544 performs a reverse process of the process that has been performed by the signal subtraction unit 343 of the encoding unit 34.

The amplitude adjustment unit 545 generates the tactile signal TS before being normalized by the encoding unit 34 on the basis of the normalization coefficient (the adjustment value) SF that has been acquired by the information acquisition unit 541 and the normalized tactile signal TS that has been generated by the signal addition unit 544. Specifically, the amplitude adjustment unit 545 multiplies the tactile signal TS that has been normalized by the normalization coefficient SF to generate the tactile signal TS before being normalized.

2.3. Operation Example

Subsequently, examples of operation flows of the tactile recording system RCS and the tactile reproducing system RGS according to the present embodiment will be described with reference to FIGS. 15 and 16.

[2.3.1. Operation Example of Tactile Recording System RCS]

Figure 15:
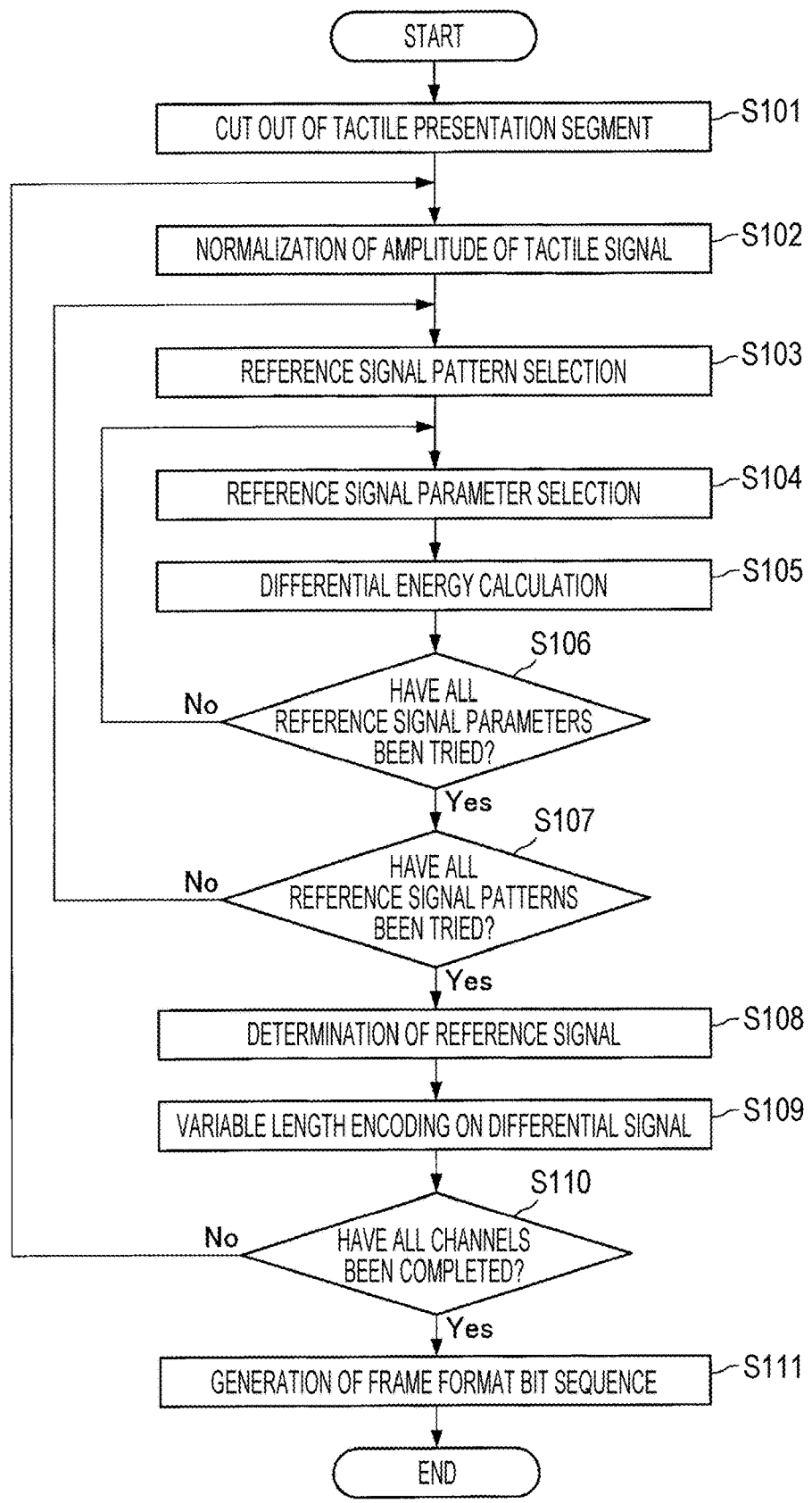
FIG. 15 is a diagram for describing an example of an operation flow of a tactile recording system RCS according to the embodiment.

FIG. 15 is a diagram for describing an example of an operation flow of the tactile recording system RCS according to the present embodiment. Referring to FIG. 15, first, the normalization unit 341 cuts out a predetermined segment of the tactile signal TS that has been transmitted from the tactile sensor 2 (S101). Next, the normalization unit 341 normalizes the amplitude of the tactile signal TS cut out in step S101 (S102). It is to be noted that in step S102, the normalization unit 341 transmits the normalization coefficient SF related to the amplitude that has been normalized to the coefficient quantization unit 345.

Next, the reference signal pattern selection unit 342 selects a reference signal pattern (S103). Next, the reference signal pattern selection unit 342 selects a parameter corresponding to the reference signal pattern selected in step S103, and generates the reference signal SS (S104). Next, the signal subtraction unit 343 calculates a differential between the tactile signal TS normalized in step S102 and the reference signal SS generated in step S104, and generates a differential signal DS, and the adjustment unit 344 calculates the energy of the differential signal DS (S105).

In a case where all the energy of the differential signals DS that can be generated by the parameters corresponding to the reference signal patterns is not calculated (S106: No), the process returns to step S104. In a case where all the energy of the differential signals DS that can be generated by the parameters corresponding to the reference signal patterns is calculated (S106: Yes) and all the energy of the differential signals DS in all the reference signal patterns is not calculated (S107: No), the process returns to step S103. In a case where all the energy of the differential signals DS in all the reference signal patterns is calculated (S107: Yes), the adjustment unit 344 determines that the signal corresponding to the differential signal DS having the smallest energy calculated in step S105 is a reference signal SS (S108).

It is to be noted that the energy of the differential signal DS in all the parameters may not necessarily be calculated in step S106. For example, the process may proceed to step S107 at the time when the energy of the differential signals DS of a predetermined number or more is calculated. In a similar manner, the energy of the differential signal DS in all the reference signal patterns may not necessarily be calculated in step S107. For example, the process may proceed to step S108 at the time when the energy of the differential signals DS of a predetermined number or more is calculated.

Further, in step S108, in a case where the reference signal SS is determined, the adjustment unit 344 transmits to the parameter quantization unit 346, information regarding the reference signal SS corresponding to the reference signal SS that has been determined. The parameter quantization unit 346 quantizes the information regarding the reference signal SS, and transmits the information to the format unit 348. Further, in step S108, in a case where the reference signal SS is determined, the coefficient quantization unit 345 quantizes the normalization coefficient SF, and transmits the quantized normalization coefficient to the format unit 348.

After the process of step S108, the differential encoding unit 347 performs the variable length encoding on the differential signal DS determined in step S108 (S109). Next, in a case where the process up to step S109 has not been completed for all channels (S110: No), the process returns to step S102. In a case where the process up to step S109 has been completed for all channels (S110: Yes), the format unit 348 generates a frame format bit sequence (S111), and the tactile recording system RCS ends the operation.

[2.3.2. Operation Example of Tactile Reproducing System RGS]

Figure 16:
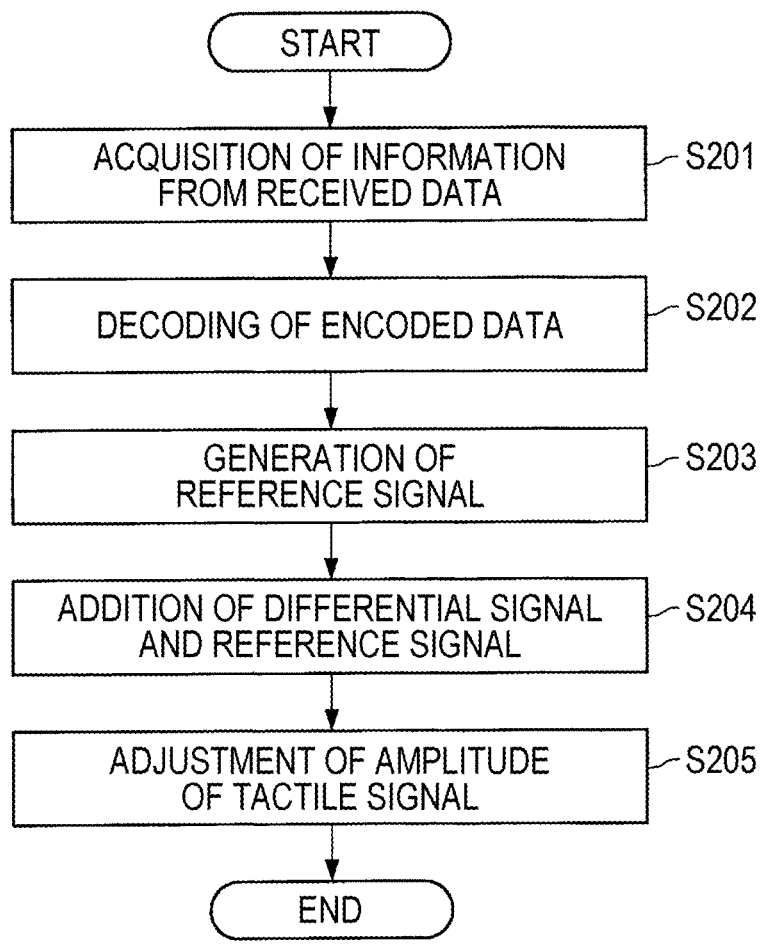
FIG. 16 is a diagram for describing an example of an operation flow of a tactile reproducing system RGS according to the embodiment.

FIG. 16 is a diagram for describing an example of an operation flow of the tactile reproducing system RGS according to the present embodiment. Referring to FIG. 16, first, the information acquisition unit 541 acquires various information necessary for generating the tactile signal TS from the transmission and reception data TD (S201). Next, the differential signal decoding unit 543 decodes the differential signal DS that has been encoded from the encoded data DC on the basis of the information acquired in step S201 (S202).

Next, the reference signal generation unit 542 generates a reference signal on the basis of the information regarding the reference signal SS acquired in step S201 (S203). Next, the signal addition unit 544 adds the differential signal DS acquired in step S202 and the reference signal generated in step S203 to acquire the tactile signal TS (S204). Next, the amplitude adjustment unit 545 adjusts the amplitude of the tactile signal TS acquired in step S204 (S205), and the tactile reproducing system RGS ends the operation.

2.4. Modification Example

Subsequently, modification examples according to the present embodiment will be described.

Heretofore, an example in which the encoding unit 34 encodes a single signal in the same method has been described. However, the encoding unit 34 may determine the encoding method for every frequency band of the differential signal DS. Specifically, the encoding unit 34 may conduct higher-efficiency encoding on a high-band tactile signal TS so that the quality with no significant difference in perception can be maintained as compared with other bands. Further, the encoding unit 34 may conduct more efficient encoding on the tactile signal TS on a frequency band larger than a predetermined frequency band. On the other hand, it is supposed that low-band signals excluding high-band signals, which are likely to form a complicated waveform, exhibit a high correlation with the reference signal SS. By determining the encoding method for every frequency band in this manner, the effect of information compression obtained by the variable length encoding on the differential signal DS is further expected.

Hereinafter, details will be described with reference to FIGS. 17 and 18. FIG. 17A is a diagram for describing a functional configuration example of an encoding unit 74 in a modification example according to the present embodiment. As shown in FIG. 17A, the encoding unit 74 includes a band division unit 741, a low-band signal encoding unit 742, a high-band signal encoding unit 743, and a synthesis unit 744. In the present modification example, the encoding unit 74 functions as a substitute for the encoding unit 34 shown in FIG. 4. That is, a normalization unit 7421 to a format unit 7428 included in the low-band signal encoding unit 742 are respectively similar to the normalization unit 341 to the format unit 348 shown in FIG. 4.

The band division unit 741 divides the tactile signal TS that has been input into every predetermined band. For example, the band division unit 741 may transmit the tactile signal TS up to 1 kHz to the low-band signal encoding unit 742, and may transmit the tactile signal TS from 1 kHz to 2 kHz to the high-band signal encoding unit 743.

The low-band signal encoding unit 742 functions in a similar manner to the encoding unit 34 shown in FIG. 4, and transmits the data that has been generated to the synthesis unit 744.

The high-band signal encoding unit 743 conducts higher-quality encoding on the tactile signal TS on a high band than the low-band signal encoding unit 742. For example, the high-band signal encoding unit 743 conducts noise shaped encoding on the tactile signal TS on the high band. The noise shaped encoding will be described later.

The synthesis unit 744 synthesizes data that has been transmitted from the low-band signal encoding unit 742 and data that has been transmitted from the high-band signal encoding unit 743 to generate final transmission and reception data TD.

Figure 17B:
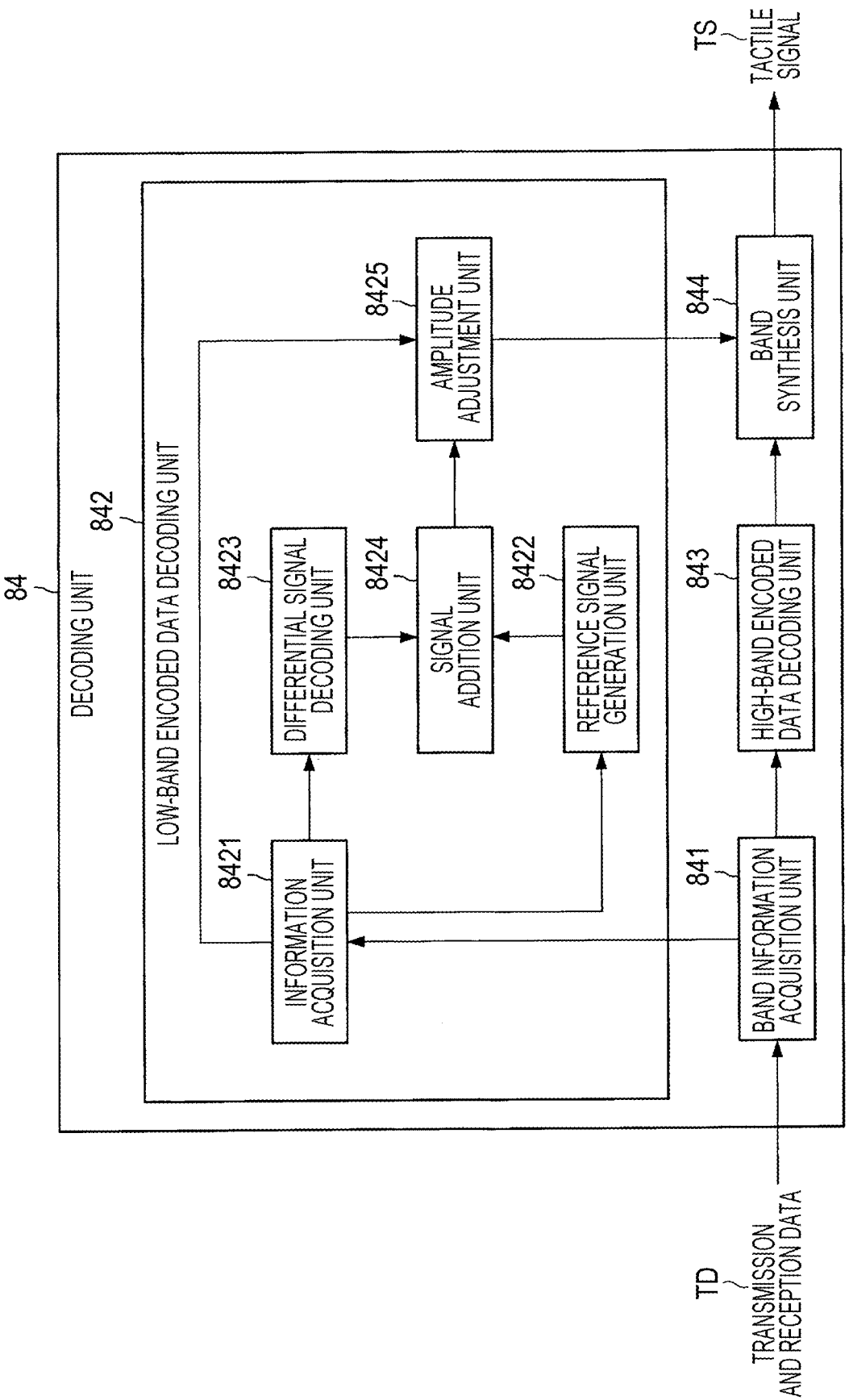
FIG. 17B is a diagram for describing a functional configuration example of a decoding unit 84 in a modification example according to the embodiment.

FIG. 17B is a diagram for describing a functional configuration example of the decoding unit 84 in a modification example according to the present embodiment. As shown in FIG. 17B, the decoding unit 84 includes a band information acquisition unit 841, a low-band encoded data decoding unit 842, a high-band encoded data decoding unit 843, and a band synthesis unit 844. In the present modification example, the decoding unit 84 functions as a substitute for the decoding unit 54 shown in FIG. 14. Further, an information acquisition unit 8421 to an amplitude adjustment unit 8425 included in the low-band encoded data decoding unit 842 are respectively similar to the information acquisition unit 541 to the amplitude adjustment unit 545 shown in FIG. 14.

The band information acquisition unit 841 acquires information regarding a division of a band from the transmission and reception data TD that has been input, and transmits data of a low-band part to the low-band encoded data decoding unit 842 and data of a broadband part to the high-band encoded data decoding unit 843 on the basis of the information that has been acquired.

The low-band encoded data decoding unit 842 functions in a similar manner to the decoding unit 54 shown in FIG. 14, and transmits the data that has been generated to the band synthesis unit 844.

The high-band encoded data decoding unit 843 decodes the data on which noise shaped encoding has been performed, and transmits decoded data to the band synthesis unit 844.

The band synthesis unit 844 synthesizes the data that has been transmitted from the low-band encoded data decoding unit 842 and the data that has been transmitted from the high-band encoded data decoding unit 843 to generate a tactile signal TS.

Figure 18A:
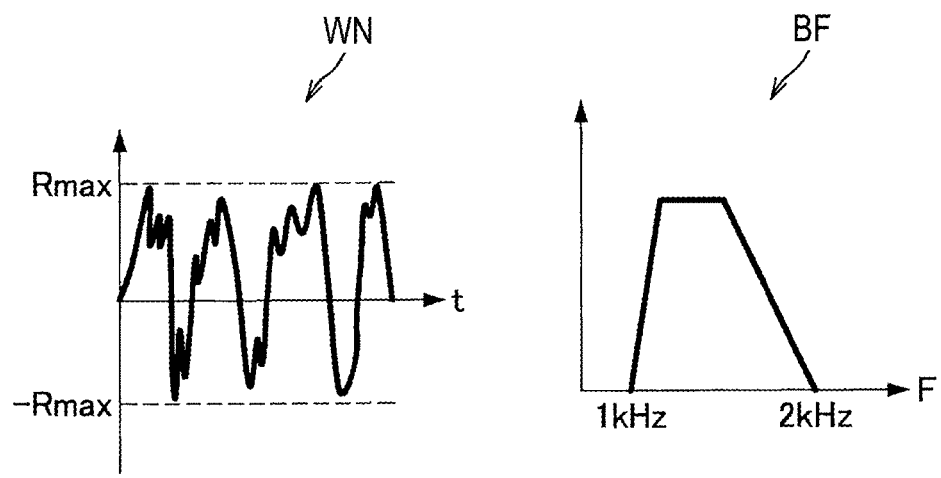
FIG. 18A is a diagram for describing noise shaped encoding in a modification example according to the embodiment.
Figure 18B:
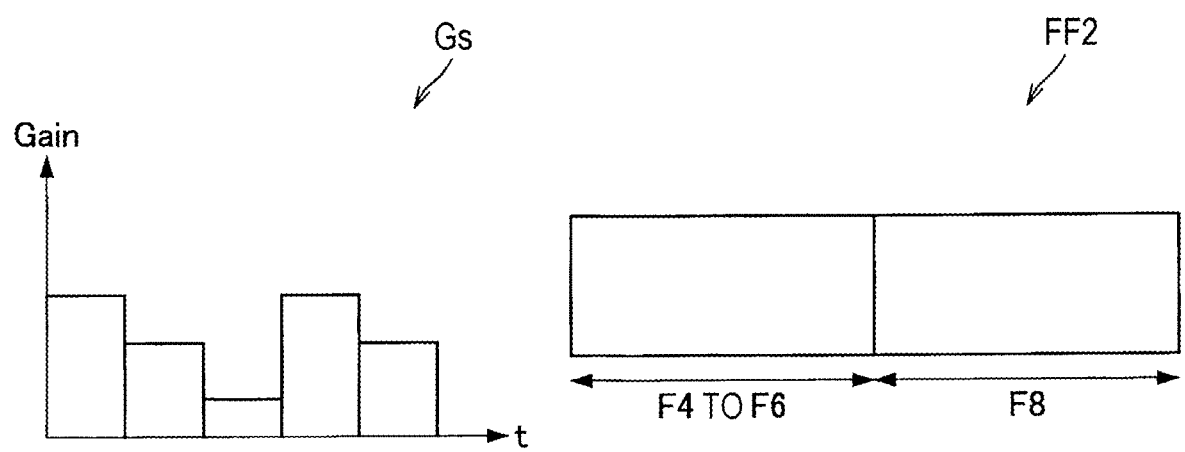
FIG. 18B is a diagram for describing the noise shaped encoding in a modification example according to the embodiment.

Subsequently, the noise shaped encoding will be described with reference to FIGS. 18A and 18B. FIGS. 18A and 18B are diagrams for describing the noise shaped encoding in a modification example according to the present embodiment.

First, referring to FIG. 18A, a white noise WN and a bandpass filter BF are shown. The white noise WN is normalized by the maximum amplitude of a quantized bit length of the tactile signal TS. By applying the bandpass filter BF from 1 kHz to 2 kHz to the white noise WN, a gain coefficient GS shown in FIG. 18B is generated. By encoding the gain coefficient GS for every sample of a predetermined time, an envelope waveform of a signal from 1 kHz to 2 kHz can be roughly reproduced.

On the right side of FIG. 18B, a frame format FF2 related to data that has been subject to the noise shaped encoding is shown. Formats F4 to F6 of the frame format FF2 related to the data that has been subject to the noise shaped encoding are similar to the formats F4 to F6 shown in FIG. 14. In a format F8, for example, data in which a gain coefficient of a sampling time for 10 samples has been quantized is recorded.

In this manner, by conducting high-efficient encoding on the tactile signal TS on a high-frequency band, the compression rate of the data to be transmitted and received can be increased and the signal can be transmitted and received in a state where the quality is further maintained.

3. HARDWARE CONFIGURATION EXAMPLE

Figure 19:
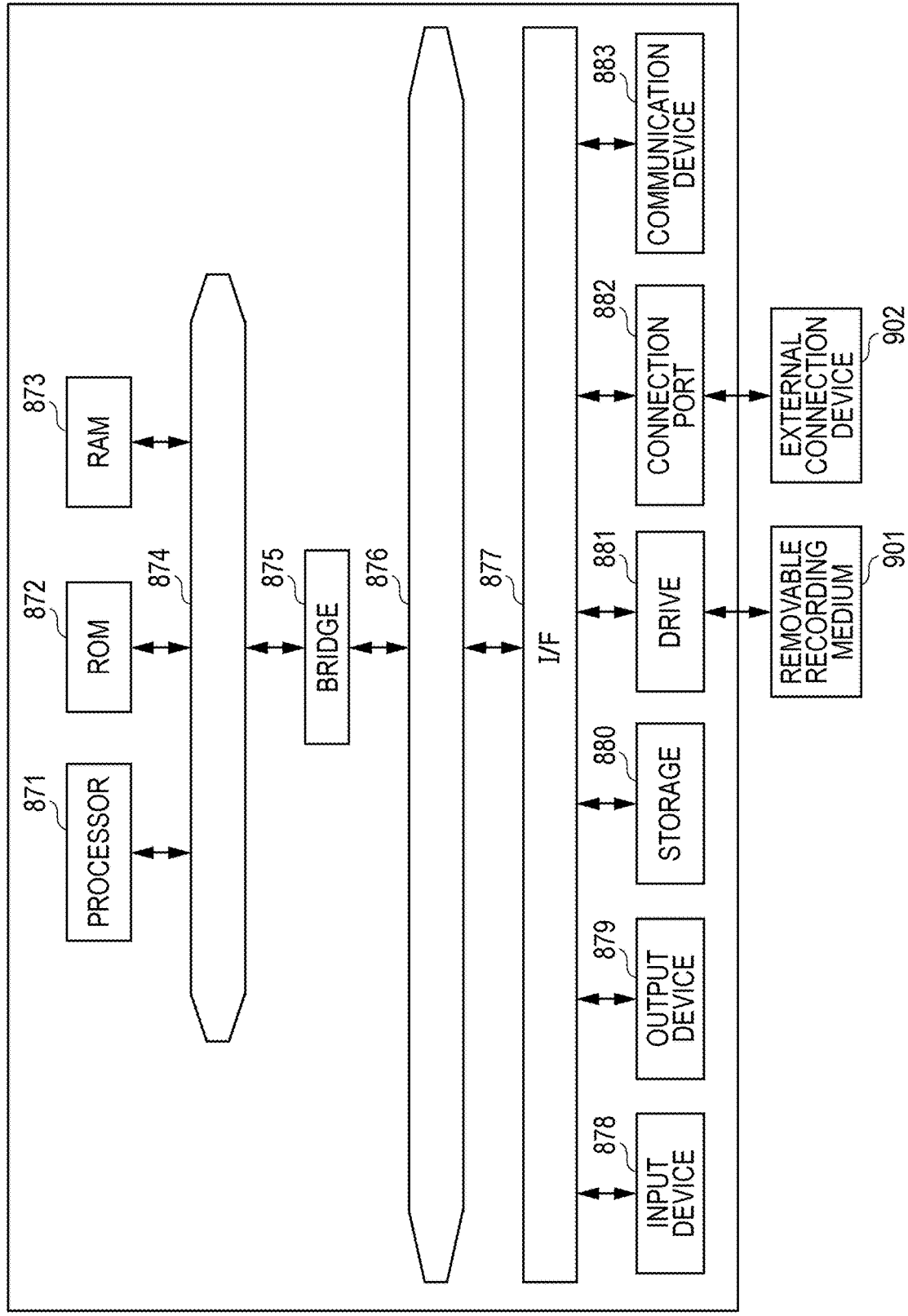
FIG. 19 is a block diagram showing a hardware configuration example of the encoding device 3 and the decoding device 5 according to an embodiment of the present disclosure.

Next, a hardware configuration example common to the encoding device 3 and the decoding device 5 according to an embodiment of the present disclosure will be described. FIG. 19 is a block diagram showing a hardware configuration example of the encoding device 3 and the decoding device 5 according to an embodiment of the present disclosure. Referring to FIG. 19, the encoding device 3 and the decoding device 5 each include, for example, a processor 871, a ROM 872, a RAM 873, a host bus 874, a bridge 875, an external bus 876, an interface 877, an input device 878, an output device 879, a storage 880, a drive 881, a connection port 882, and a communication device 883. It is to be noted that the hardware configuration shown here is an example, and some of the components may be omitted. In addition, components other than the components shown here may be further included.

(Processor 871)

The processor 871 functions as, for example, an arithmetic processing unit or a control device, and controls all or a part of an operation of each component on the basis of various programs recorded in the ROM 872, the RAM 873, the storage 880, or a removable recording medium 901.

(ROM 872, RAM 873)

The ROM 872 is a means for storing programs to be read into the processor 871, data used for arithmetic processing, and the like. The RAM 873 temporarily or permanently stores, for example, a program to be read by the processor 871, various parameters that change as appropriate when the program is performed, and the like.

(Host Bus 874, Bridge 875, External Bus 876, Interface 877)

The processors 871, the ROM 872, and the RAM 873 are connected to one another through, for example, a host bus 874 enabling high-speed data transmission. On the other hand, the host bus 874 is connected with the external bus 876, data transmission speed of which is relatively low, through the bridge 875, for example. In addition, the external bus 876 is connected with various components through the interface 877.

(Input Device 878)

For the input device 878, for example, a mouse, a keyboard, a touch panel, a button, a switch, a lever, and the like are used. Moreover, for the input device 878, a remote controller (hereinafter referred to as a remote control) capable of transmitting a control signal using infrared rays or other radio waves may be used. Further, the input device 878 includes a voice input device such as a microphone.

(Output Device 879)

The output device 879 is a device capable of visually or audibly notifying a user of information that has been acquired, for example, a display device such as a cathode ray tube (CRT), an LCD, or an organic EL, an audio output device such as a speaker or a headphone, a printer, a mobile telephone, a facsimile, or the like. Further, the output device 879 according to the present disclosure includes various vibration devices capable of outputting tactile stimuli.

(Storage 880)

The storage 880 is a device for storing various types of data. For the storage 880, for example, a magnetic storage device such as a hard disk drive (HDD), a semiconductor storage device, an optical storage device, an optical magnetic storage device, or the like is used.

(Drive 881)

The drive 881 is a device for reading information recorded on the removable recording medium 901, for example, a magnetic disk, an optical disk, a magneto-optical disk, a semiconductor memory, or the like, or for writing information into the removable recording medium 901.

(Removable Recording Medium 901)

The removable recording medium 901 is, for example, a DVD media, a Blu-ray (registered trademark) media, an HD DVD media, various semiconductor storage media, and the like. It is a matter of course that the removable recording medium 901 may be, for example, an IC card equipped with a non-contact IC chip, an electronic device, or the like.

(Connection Port 882) The connection port 882 is a port for connecting an external connection device 902, for example, a universal serial bus (USB) port, an IEEE 1394 port, a small computer system interface (SCSI), an RS-232C port, an optical audio terminal, or the like.

(External Connection Device 902)

The external connection device 902 is, for example, a printer, a portable music player, a digital camera, a digital video camera, an IC recorder, or the like.

(Communication Device 883)

The communication device 883 is a communication device for making a connection with a network, for example, a communication card for wired or wireless LAN, Bluetooth (registered trademark), or wireless USB (WUSB), a router for optical communication, a router for asymmetric digital subscriber line (ADSL), modems for various types of communication, or the like.

4. CONCLUSION

Heretofore, as described above, the tactile recording system RCS according to the present embodiment encodes the differential signal DS that has been acquired by using the reference signal SS having a high correlation with the tactile signal TS, so that the data amount for transmission and reception can be further compressed. Further, as described above, the tactile reproducing system RGS according to the present embodiment has a function of decoding the data in which the differential signal DS has been encoded, and according to such a function, the tactile reproducibility and a reduction in the data amount to be transmitted and received are both enabled.

Although the preferred embodiments of the present disclosure have been described in detail with reference to the accompanying drawings, the technical scope of the present disclosure is not limited to such examples. It is clear that anyone with ordinary knowledge in the technical field of the present disclosure may come up with various changed examples or modified examples within the scope of the technical ideas set forth in the claims. It is naturally understood that they belong to the technical scope of the present disclosure.

In addition, the effects described herein are merely explanatory or exemplary, and are not limited. That is, the techniques according to the present disclosure may exhibit other effects apparent to those skilled in the art from the description herein, in addition to or in place of the above effects.

It is to be noted that the following configurations also belong to the technical scope of the present disclosure.

(1)

A decoding device including:

a decoding unit configured to decode encoded data in which a differential signal that includes a differential between a tactile signal and a reference signal has been encoded; and a signal addition unit configured to add the reference signal and the differential signal.

(2)

The decoding device described in the above (1), further including a reference signal generation unit configured to generate the reference signal on the basis of information regarding the reference signal that has been received, in which in a case where a plurality of candidate signals for the reference signal is present, the reference signal includes any signal of the plurality of candidate signals, and the signal addition unit adds the reference signal that has been generated by the reference signal generation unit and the differential signal.

(3)

The decoding device described in the above (2), in which the reference signal includes a signal having a smaller differential from the tactile signal than another candidate signal, and the reference signal generation unit generates the reference signal having the smaller differential from the tactile signal than the another candidate signal on the basis of the information regarding the reference signal that has been received.

(4)

The decoding device described in the above (3), in which the reference signal includes a signal having a smaller differential in an amplitude, a phase, and a duration from the tactile signal than the another candidate signal, and the reference signal generation unit generates the reference signal having the smaller differential in the amplitude, the phase, and the duration from the tactile signal than the another candidate signal on the basis of the information regarding the reference signal that has been received.

(5)

The decoding device described in the above (3) or (4), in which the reference signal includes a signal having a smaller differential in energy from the tactile signal than the another candidate signal, and the reference signal generation unit generates the reference signal having the smaller differential in the energy from the tactile signal than the another candidate signal on the basis of the information regarding the reference signal that has been received.

(6)

The decoding device described in any one of the above (2) to (5), in which the reference signal includes a signal corresponding to a parameter of the reference signal, the information regarding the reference signal includes information indicating the parameter of the reference signal, and the reference signal generation unit generates the reference signal corresponding to the parameter of the reference signal on the basis of the information indicating the parameter of the reference signal that has been received.

(7)

The decoding device described in the above (6), in which the reference signal includes an attenuated sinusoidal signal corresponding to the parameter of the reference signal, the reference signal generation unit generates the attenuated sinusoidal signal corresponding to the parameter of the reference signal, and the signal addition unit adds the attenuated sinusoidal signal that has been generated by the reference signal generation unit and the differential signal.

(8)

The decoding device described in the above (7), in which the parameter of the reference signal includes parameters indicating a frequency, a phase, and a duration of the attenuated sinusoidal signal, and the reference signal generation unit generates the attenuated sinusoidal signal having the frequency, the phase, and the duration indicated by the parameters of the reference signal.

(9)

The decoding device described in the above (6), in which the parameter of the reference signal includes a parameter corresponding to a predetermined scene, the reference signal includes a signal that has been generated on the basis of the parameter corresponding to the predetermined scene, the reference signal generation unit generates the reference signal corresponding to the predetermined scene indicated by the parameter of the reference signal, and the signal addition unit adds the reference signal corresponding to the predetermined scene that has been generated by the reference signal generation unit and the differential signal.

(10)

The decoding device described in the above (9), in which the parameter of the reference signal includes parameters further indicating identification information corresponding to the predetermined scene and a duration of the reference signal, and the reference signal generation unit generates the reference signal corresponding to the identification information and the duration indicated by the parameters of the reference signal.

(11)

The decoding device described in the above (6), in which in a case where a plurality of the tactile signals is present, the reference signal includes any tactile signal, the parameter of the reference signal includes a parameter indicating the reference signal corresponding to which tactile signal of the plurality of the tactile signals, and the signal addition unit adds the reference signal corresponding to the tactile signal that has been generated by the reference signal generation unit and the differential signal.

(12)

The decoding device described in the above (11), in which the parameter of the reference signal includes parameters further indicating an attenuation rate and a time difference with respect to the tactile signal indicated by the parameter of the reference signal, and the reference signal generation unit generates the reference signal that is attenuated with respect to the tactile signal and that is delayed in starting vibration on the basis of the attenuation rate and the time difference indicated by the parameters of the reference signal.

(13)

The decoding device described in any one of the above (1) to (12), in which the encoded data includes data in which the tactile signal on a predetermined frequency band has been encoded, and the decoding unit decodes the encoded data in which the tactile signal on the predetermined frequency band has been encoded.

(14)

The decoding device described in the above (13) further including a high-band signal decoding unit configured to decode data in which the tactile signal corresponding to a frequency band larger than the predetermined frequency band has been encoded, in which the encoded data includes data in which the tactile signal corresponding to a band equal to or smaller than the predetermined frequency band has been encoded, and the decoding unit decodes the encoded data in which the tactile signal corresponding to the frequency band smaller than the predetermined frequency band has been encoded.

(15)

The decoding device described in any one of the above (2) to (14), in which the information regarding the reference signal includes information indicating an amplitude adjustment value, the decoding device further including an amplitude adjustment unit configured to adjust a maximum value of an amplitude of a signal that has been generated by addition of the signal addition unit to be substantially same with a maximum value of an amplitude of the tactile signal on the basis of the information indicating the amplitude adjustment value that has been received.

(16)

The decoding device described in any one of the above (1) to (15), in which the encoded data includes data in which variable length encoding has been conducted on the differential signal, and the decoding unit decodes the encoded data in which the variable length encoding has been conducted.

(17)

The decoding device described in any one of the above (2) to (16), further including a storage unit configured to store information regarding the reference signal, in which the signal addition unit adds the reference signal based on the information regarding the reference signal stored in the storage unit and the differential signal.

(18)

The decoding device described in any one of the above (2) to (17), further including an information acquisition unit configured to acquire the encoded data and the information regarding the reference signal on the basis of data that has been received, in which the decoding unit decodes the encoded data that has been acquired by the information acquisition unit, and the reference signal generation unit generates the reference signal on the basis of the information regarding the reference signal that has been acquired by the information acquisition unit.

(19)

A decoding method by a processor, the decoding method including:

decoding encoded data in which a differential signal that includes a differential between a tactile signal and a reference signal has been encoded; and adding the reference signal and the differential signal that has been decoded.

(20)

A program causing a computer to function as a decoding device including:

a decoding unit configured to decode encoded data in which a differential signal that includes a differential between a tactile signal and a reference signal has been encoded; and a signal addition unit configured to add the reference signal and the differential signal that has been decoded.

REFERENCE SIGNS LIST

1 Tactile presentation system
RCS Tactile recording system
2 Tactile sensor
3 Encoding device
31 Amplification unit
32 A/D conversion unit
33 Pre-processing unit
34 Encoding unit
341 Normalization unit
342 Reference signal pattern selection unit
343 Signal subtraction unit
344 Adjustment unit
345 Coefficient quantization unit
346 Parameter quantization unit
347 Differential encoding unit 348 Format unit
35 Communication unit
36 Additional information input unit
37 Storage unit
38 Control unit
RGS Tactile reproducing system
4 Reproducing device
41 Wireless communication unit
42 Communication unit
43 Storage unit
44 Control unit
5 Decoding device
51 Amplification unit
52 D/A conversion unit
53 Post-processing unit
54 Decoding unit
541 Information acquisition unit
542 Reference signal generation unit
543 Differential signal decoding unit
544 Signal addition unit
545 Amplitude adjustment unit
56 Wireless communication unit
57 Storage unit
58 Control unit
6 Tactile presentation device

The invention claimed is:

1. A decoding device comprising:
circuitry configured to function as:
a decoding unit configured to decode encoded data in which a differential signal that includes a differential between a tactile signal and a reference signal has been encoded;
a signal addition unit configured to add the reference signal and the differential signal; and
a reference signal generation unit configured to generate the reference signal on a basis of information regarding the reference signal that has been received,
wherein the reference signal includes an attenuated sinusoidal signal corresponding to the information regarding the reference signal,
the reference signal generation unit generates the attenuated sinusoidal signal corresponding to the information regarding the reference signal,
the signal addition unit adds the attenuated sinusoidal signal that has been generated by the reference signal generation unit and the differential signal,
in a case where a plurality of candidate signals for the reference signal is present, the reference signal includes any signal of the plurality of candidate signals,
the signal addition unit adds the reference signal that has been generated by the reference signal generation unit and the differential signal,
the reference signal includes a signal corresponding to at least part of the information regarding the reference signal, and
the reference signal generation unit generates the reference signal corresponding to the information regarding the reference signal.

2. The decoding device according to claim 1,
wherein the reference signal includes a signal having a smaller differential from the tactile signal than another candidate signal, and
the reference signal generation unit generates the reference signal having the smaller differential from the tactile signal than the another candidate signal on a basis of the information regarding the reference signal that has been received.

3. The decoding device according to claim 2,
wherein the reference signal includes a signal having a smaller differential in an amplitude, a phase, and a duration from the tactile signal than the another candidate signal, and
the reference signal generation unit generates the reference signal having the smaller differential in the amplitude, the phase, and the duration from the tactile signal than the another candidate signal on a basis of the information regarding the reference signal that has been received.

4. The decoding device according to claim 2,
wherein the reference signal includes a signal having a smaller differential in energy from the tactile signal than the another candidate signal, and
the reference signal generation unit generates the reference signal having the smaller differential in the energy from the tactile signal than the another candidate signal on a basis of the information regarding the reference signal that has been received.

5. The decoding device according to claim 1,
wherein the information regarding the reference signal includes parameters indicating a frequency, a phase, and a duration of the attenuated sinusoidal signal, and
the reference signal generation unit generates the attenuated sinusoidal signal having the frequency, the phase, and the duration indicated by the parameters of the reference signal.

6. The decoding device according to claim 1,
wherein the information regarding the reference signal includes a parameter corresponding to a predetermined scene,
the reference signal includes a signal that has been generated on a basis of the parameter corresponding to the predetermined scene, the reference signal generation unit generates the reference signal corresponding to the predetermined scene indicated by the information regarding the reference signal, and
the signal addition unit adds the reference signal corresponding to the predetermined scene that has been generated by the reference signal generation unit and the differential signal.

7. The decoding device according to claim 6,
wherein the information regarding the reference signal includes parameters further indicating identification information corresponding to the predetermined scene and a duration of the reference signal, and
the reference signal generation unit generates the reference signal corresponding to the identification information and the duration indicated by the parameters of the reference signal.

8. The decoding device according to claim 1,
wherein in a case where a plurality of the tactile signals is present, the reference signal includes any tactile signal,
the information regarding the reference signal includes a parameter indicating the reference signal corresponding to which tactile signal of the plurality of the tactile signals, and
the signal addition unit adds the reference signal corresponding to the tactile signal that has been generated by the reference signal generation unit and the differential signal.

9. The decoding device according to claim 8,
wherein the information regarding the reference signal includes parameters further indicating an attenuation rate and a time difference with respect to the tactile signal indicated by the information regarding the reference signal, and the reference signal generation unit generates the reference signal that is attenuated with respect to the tactile signal and that is delayed in starting vibration on a basis of the attenuation rate and the time difference indicated by the parameters of the reference signal.

10. The decoding device according to claim 1, wherein the encoded data includes data in which the tactile signal on a predetermined frequency band has been encoded, and the decoding unit decodes the encoded data in which the tactile signal on the predetermined frequency band has been encoded.

11. The decoding device according to claim 10, wherein the circuitry is further configured to function as:

a high-band signal decoding unit configured to decode data in which the tactile signal corresponding to a frequency band larger than the predetermined frequency band has been encoded, wherein the encoded data includes data in which the tactile signal corresponding to a band equal to or smaller than the predetermined frequency band has been encoded, and the decoding unit decodes the encoded data in which the tactile signal corresponding to the frequency band smaller than the predetermined frequency band has been encoded.

12. The decoding device according to claim 1, wherein the information regarding the reference signal includes information indicating an amplitude adjustment value, the circuitry is further configured to function as an amplitude adjustment unit configured to adjust a maximum value of an amplitude of a signal that has been generated by addition of the signal addition unit to be substantially same with a maximum value of an amplitude of the tactile signal on a basis of the information indicating the amplitude adjustment value that has been received.

13. The decoding device according to claim 1, wherein the encoded data includes data in which variable length encoding has been conducted on the differential signal, and the decoding unit decodes the encoded data in which the variable length encoding has been conducted.

14. The decoding device according to claim 1, further comprising a storage unit configured to store information regarding the reference signal, wherein the signal addition unit adds the reference signal based on the information regarding the reference signal stored in the storage unit and the differential signal.

15. The decoding device according to claim 1, further comprising an information acquisition unit configured to acquire the encoded data and the information regarding the reference signal on a basis of data that has been received, wherein the decoding unit decodes the encoded data that has been acquired by the information acquisition unit, and the reference signal generation unit generates the reference signal on a basis of the information regarding the reference signal that has been acquired by the information acquisition unit.

16. A decoding method by a processor, the decoding method comprising:

decoding encoded data in which a differential signal that includes a differential between a tactile signal and a reference signal has been encoded;

adding the reference signal and the differential signal that has been decoded; and generating the reference signal on a basis of information regarding the reference signal that has been received, wherein the reference signal includes an attenuated sinusoidal signal corresponding to information regarding the reference signal, the attenuated sinusoidal signal corresponding to the information regarding the reference signal is generated, the signal addition unit adds the attenuated sinusoidal signal that has been generated and the differential signal, in a case where a plurality of candidate signals for the reference signal is present, the reference signal includes any signal of the plurality of candidate signals, the reference signal that has been generated by the reference signal generation unit and the differential signal is added, the reference signal includes a signal corresponding to at least part of the information regarding the reference signal, and the reference signal corresponding to the information regarding the reference signal is generated.

17. A non-transitory storage medium encoded with instructions that, when executed by a computer, execute processing comprising:

decoding encoded data in which a differential signal that includes a differential between a tactile signal and a reference signal has been encoded;

adding the reference signal and the differential signal that has been decoded; and generating the reference signal on a basis of information regarding the reference signal that has been received, wherein the reference signal includes an attenuated sinusoidal signal corresponding to information regarding the reference signal, the attenuated sinusoidal signal corresponding to the information regarding the reference signal is generated, the signal addition unit adds the attenuated sinusoidal signal that has been generated and the differential signal, in a case where a plurality of candidate signals for the reference signal is present, the reference signal includes any signal of the plurality of candidate signals, the reference signal that has been generated by the reference signal generation unit and the differential signal is added, the reference signal includes a signal corresponding to at least part of the information regarding the reference signal, and the reference signal corresponding to the information regarding the reference signal is generated.

* * * * *